US008822287B2

(12) United States Patent
Kim et al.

(10) Patent No.: US 8,822,287 B2
(45) Date of Patent: Sep. 2, 2014

(54) METHODS OF MANUFACTURING SEMICONDUCTOR DEVICES

(75) Inventors: Hyo-Jung Kim, Seoul (KR); Ki-hyun Hwang, Seongnam-si (KR); Kyung-Hyun Kim, Seoul (KR); Han-Mei Choi, Seoul (KR); Dong-Chul Yoo, Seongnam-si (KR); Chan-Jin Park, Yongin-si (KR); Jong-Heun Lim, Seoul (KR); Myung-Jung Pyo, Hwaseong-si (KR); Byoung-Moon Yoon, Suwon-si (KR); Chang-Sup Mun, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 241 days.

(21) Appl. No.: 13/313,754

(22) Filed: Dec. 7, 2011

(65) Prior Publication Data
US 2012/0149185 A1 Jun. 14, 2012

(30) Foreign Application Priority Data

Dec. 10, 2010 (KR) .................. 10-2010-0126029
Feb. 21, 2011 (KR) .................. 10-2011-0014972

(51) Int. Cl.
*H01L 21/336* (2006.01)
(52) U.S. Cl.
USPC ............ 438/261; 438/589; 438/268; 438/592
(58) Field of Classification Search
CPC .............. H01L 27/115; H01L 29/7802; H01L 29/66621; H01L 21/28061
USPC .................... 438/261, 268, 589, 592
See application file for complete search history.

(56) References Cited

U.S. PATENT DOCUMENTS

| 5,384,474 | A | * | 1/1995 | Park et al. | 257/304 |
| 5,540,811 | A | * | 7/1996 | Morita | 438/634 |
| 5,714,779 | A | * | 2/1998 | Auer et al. | 257/306 |
| 5,828,120 | A | * | 10/1998 | Ishikawa | 257/499 |
| 5,880,039 | A | * | 3/1999 | Lee | 438/763 |
| 5,976,949 | A | * | 11/1999 | Chen | 438/427 |
| 6,010,933 | A | * | 1/2000 | Cherng | 438/253 |
| 6,271,123 | B1 | * | 8/2001 | Jang et al. | 438/633 |
| 6,326,309 | B2 | * | 12/2001 | Hatanaka et al. | 438/693 |
| 6,358,816 | B1 | * | 3/2002 | Singh et al. | 438/424 |
| 6,423,639 | B1 | * | 7/2002 | Hong | 438/690 |
| 6,617,663 | B2 | * | 9/2003 | Horie et al. | 257/510 |
| 2002/0192887 | A1 | * | 12/2002 | Adachi et al. | 438/197 |
| 2009/0230462 | A1 | | 9/2009 | Tanaka et al. | |
| 2009/0242967 | A1 | | 10/2009 | Katsumata et al. | |
| 2010/0052042 | A1 | | 3/2010 | Tanaka et al. | |

FOREIGN PATENT DOCUMENTS

JP 6-295908 10/1994
KR 20000004362 A 1/2000

\* cited by examiner

*Primary Examiner* — Jarrett Stark
*Assistant Examiner* — Mohammad M Hoque
(74) *Attorney, Agent, or Firm* — Harness, Dickey & Pierce, P.L.C.

(57) ABSTRACT

Methods of manufacturing semiconductor devices include forming an integrated structure and a first stopping layer pattern in a first region. A first insulating interlayer and a second stopping layer are formed. A second preliminary insulating interlayer is formed by partially etching the second stopping layer and the first insulating interlayer in the first region. A first polishing is performed to remove a protruding portion. A second polishing is performed to expose the first and second stopping layer patterns.

10 Claims, 23 Drawing Sheets

METHODS OF MANUFACTURING SEMICONDUCTOR DEVICES

CROSS-REFERENCE TO RELATED APPLICATIONS

This application claims priority under 35 USC §119 to Korean Patent Application Nos. 10-2010-0126029, filed on Dec. 10, 2010 and 10-2011-0014972, filed on Feb. 21, 2011 in the Korean Intellectual Property Office (KIPO), the entire contents of which are incorporated herein by reference.

BACKGROUND

1. Field

Example embodiments relate to methods of manufacturing semiconductor devices. More particularly, example embodiments relate to methods of manufacturing vertical type semiconductor devices having high reliability by reducing a process defect ratio.

2. Description of the Related Art

An integrating method of cells along a vertical direction on a substrate accomplishes a high integration density of semiconductor devices. To manufacture vertical type semiconductor devices including a plurality of vertically integrated cells, a large number of thin layers may be integrated in a cell region and a height of a structure including the integrated cells and formed in the cell region may become large. Therefore, a height of channel layer patterns forming memory cells may be high to accomplish the high integration degree of the memory devices. In addition, a formation of the channel layer patterns having uniform heights may become difficult.

Further, a height of thin layers for forming circuits may be relatively low in a peripheral region when compared to the cell region. Accordingly, a thickness of a step difference between thin layers formed in the cell region and the peripheral region may become large. Due to the step difference formed between the thin layers formed in the cell region and the peripheral region, a large step difference may be formed in an insulating interlayer covering the thin layers in the cell region and the peripheral region. Although a polishing process may be performed with respect to the insulating interlayer, the insulating interlayer including a low step difference portion may not be completely removed because of the step difference formed in the insulating interlayer across the cell region and the peripheral region, thereby generating a residue defect. In addition, dishing may be generated in the insulating interlayer covering the low step difference portion.

SUMMARY

Example embodiments may provide methods of manufacturing semiconductor devices having high reliability by reducing process defect generation due to a step difference formed in thin layers across a cell region and a peripheral region.

According to some example embodiments, there is provided a method of manufacturing a semiconductor device. In the method, an integrated structure and a first stopping layer pattern are formed in a first region of a substrate. The substrate includes the first region and a second region. A first insulating interlayer is formed for covering the first stopping layer pattern on the substrate in the first and second regions. An upper surface portion of the first insulating interlayer in the second region is formed to be same as or higher than a bottom portion of the first stopping layer pattern. Then, a second stopping layer is formed on the first insulating interlayer. A second preliminary insulating interlayer is formed by partially etching the second stopping layer and the first insulating interlayer formed in the first region. A first polishing of the second preliminary insulating interlayer and a portion of the second stopping layer is performed to remove a protruded portion of the second preliminary insulating interlayer at a boundary of the first and second regions. A second polishing of the second preliminary insulating interlayer is performed to expose the first stopping layer pattern and the second stopping layer to form a second stopping layer pattern and a second insulating interlayer on the substrate in the second region.

According to example embodiments, a height difference between the upper surface portion of the first insulating interlayer in the second region and the bottom portion of the first stopping layer pattern may be less than about 2,000 Å. According to example embodiments, the integrated structure and the first stopping layer pattern may be formed by performing the following processes. First, a mold layer may be formed by alternately integrating silicon oxide and silicon nitride on the substrate. Then, the first stopping layer may be formed on the mold layer. The first stopping layer and the mold layer may be patterned to form the integrated structure and the first stopping layer pattern having a stair shape sidewall edge portion on the substrate in the first region.

According to example embodiments, the first stopping layer pattern and the second stopping layer may be respectively formed using a material having a polishing selectivity with respect to the first insulating interlayer. According to example embodiments, the first stopping layer pattern may be formed using polysilicon, the first insulating interlayer may be formed using silicon oxide and the second stopping layer may be formed using silicon, nitride. According to example embodiments, a thickness difference between the first stopping layer pattern and the second stopping layer may be less than about 2,000 Å. According to example embodiments, a channel layer pattern penetrating the integrated structure may be formed, and a thin layer structure may be formed by integrating a blocking dielectric layer, a charge storing layer and a tunnel insulating layer on a sidewall portion of the channel layer pattern. Then, the sacrificial layer pattern included in the mold structure may be removed. A gate electrode may be formed at a space generated by removing the sacrificial layer pattern.

According to other example embodiments, there is provided a method of manufacturing a semiconductor device. According to the method, an integrated structure, a first insulating interlayer pattern, a first stopping layer pattern, a second insulating interlayer pattern and a second stopping layer pattern are formed in a first region on a substrate. The substrate includes the first region and a second region. A third insulating interlayer pattern having an upper surface portion on a same plane of an upper surface portion of the second stopping layer pattern is formed in the second region of the substrate. Then, the second stopping layer pattern is removed. A preliminary channel layer pattern penetrating a portion of the second insulating interlayer pattern, the first stopping layer, the first insulating interlayer pattern and the integrated layer pattern are formed. A portion of the preliminary channel layer pattern is partially removed and residue remaining at a step difference on upper surface portions of the second insulating interlayer and the third insulating interlayer is removed. The preliminary channel layer pattern, the second insulating interlayer pattern and the third insulating interlayer pattern are polished to expose an upper surface portion of the first stopping layer pattern and to form a channel pattern structure.

According to example embodiments, the stopping layer pattern may be formed using a material having an etching selectivity with respect to the preliminary channel layer pattern and the first, second and third insulating interlayers. According to example embodiments, the first stopping layer pattern may include silicon nitride or silicon oxynitride. According to example embodiments, the second stopping layer pattern may be formed using a material having a polishing selectivity with respect to the second and third insulating interlayer patterns. According to example embodiments, the second insulating interlayer pattern may be thicker than the second stopping layer pattern. According to example embodiments, the removal of the residue may be performed by a wet etching process, and an upper surface portion of the preliminary channel layer pattern may be higher than an upper surface portion of the first stopping layer pattern after performing the wet etching process.

According to example embodiments, the preliminary channel layer pattern may be formed by the following processes. First, the second insulating interlayer pattern, the first stopping layer pattern, the first insulating interlayer pattern and the integrated structure may be partially etched to form channel holes. Then, a first polysilicon pattern may be formed on an inner surface portion of the channel holes. An insulating layer pattern filling up a portion of the channel holes may be formed. The insulating layer pattern may be formed on the first polysilicon pattern. A second polysilicon pattern filling up the channel holes may be formed. The second polysilicon pattern may be formed on the insulating layer pattern.

According to example embodiments, a blocking dielectric layer, a charge storing layer, a tunnel insulating layer and a gate electrode may be formed on a sidewall portion of the channel pattern structure. According to example embodiments, the third insulating interlayer may be formed by the following processes. First, a third insulating interlayer covering the second stopping layer pattern may be formed. An upper surface portion of the third insulating interlayer may be formed at a same position or at a higher position than a bottom portion of the second stopping layer pattern. Then, the third insulating interlayer may be polished to expose an upper surface portion of the second stopping layer pattern and to form a third insulating interlayer pattern.

According to example embodiments, the integrated structure, the first insulating interlayer pattern, the first stopping layer pattern, the second insulating interlayer pattern and the second stopping layer pattern may be formed by the following processes. First, a mold layer may be formed by repeatedly integrating silicon oxide and silicon nitride on the substrate. Then, a first insulating interlayer, a first stopping layer, a second insulating interlayer and a second stopping layer may be formed on the mold layer. The mold layer, the first insulating interlayer, the first stopping layer, the second insulating interlayer and the second stopping layer may be patterned.

According to example embodiments, although a large step difference may be formed in thin layers formed over a structure having different heights in accordance with regions of a substrate while manufacturing a semiconductor device, generation of a dishing defect or a residue defect due to the step difference formed at the upper surface portion of the insulating interlayer formed over the thin layers may be reduced. Particularly, a vertical type semiconductor device with high reliability may be manufactured.

According to at least one example embodiment, a method of manufacturing a semiconductor device includes forming a stacked structure on a surface of a substrate, the stacked structure including an integrated structure, a first stopping layer and a second stopping layer, the first stopping layer between the integrated structure and the second stopping layer, forming an interlayer insulating layer at least adjacent to the stacked structure on the substrate such that a surface of the interlayer insulating layer that is farthest from the substrate is at about one of a same and a greater distance from the substrate than a surface of the first stopping layer that is closest to the substrate, and polishing the interlayer insulating layer such that the first stopping layer is exposed during the polishing.

BRIEF DESCRIPTION OF THE DRAWINGS

Example embodiments will be more clearly understood from the following brief description taken in conjunction with the accompanying drawings.

FIGS. 1-7 are cross-sectional diagrams illustrating methods of manufacturing semiconductor devices using planarization according to some example embodiments;

FIGS. 8-15 are cross-sectional diagrams illustrating methods of manufacturing vertical type semiconductor devices according to other example embodiments;

FIGS. 16-22 are across-sectional views illustrating methods of manufacturing vertical type semiconductor devices according to further example embodiments;

FIGS. 23-28 are cross-sectional diagrams illustrating methods of manufacturing semiconductor device channel pattern structures according to yet other example embodiments;

FIGS. 29-32 are cross-sectional diagrams illustrating methods of manufacturing semiconductor device channel pattern structures according to still other example embodiments;

FIGS. 33-44 are cross-sectional diagrams illustrating methods of manufacturing vertical type semiconductor devices according to still further example embodiments;

FIG. 45 is a block diagram illustrating example devices including vertical type semiconductor devices according to example embodiments;

FIG. 46 is a block diagram illustrating other example devices including vertical type semiconductor devices according to still other example embodiments; and FIG. 47 is a block diagram illustrating yet other example devices including vertical type semiconductor devices according to further example embodiments.

Figure 1:
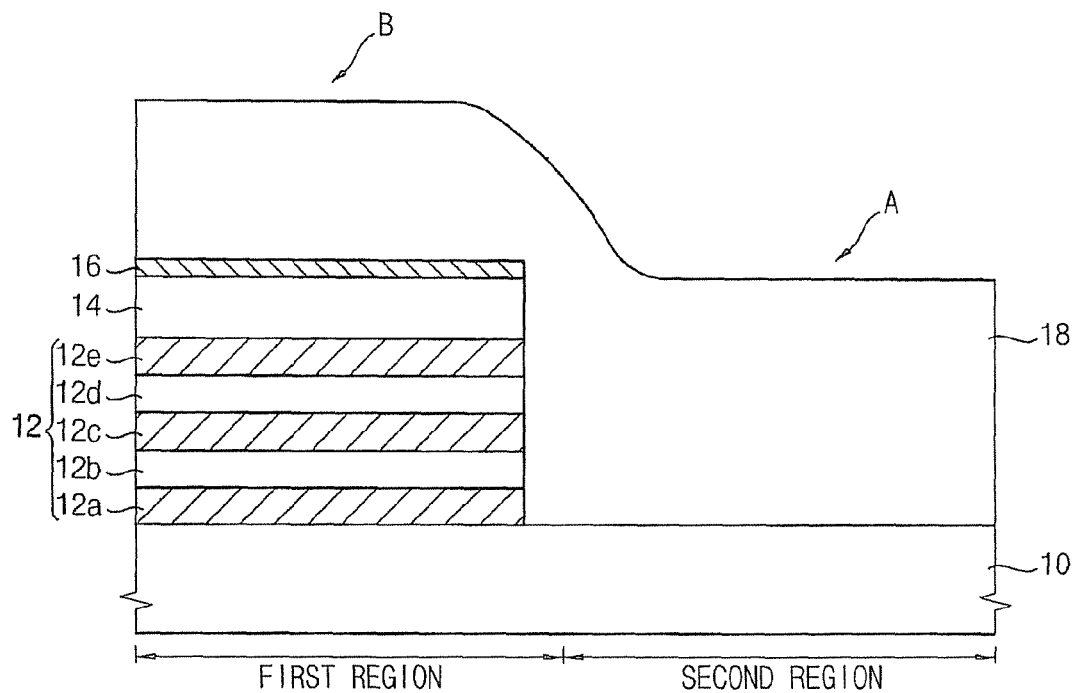
FIGS. 1-47 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1-7 are cross-sectional diagrams illustrating methods of manufacturing semiconductor devices using planarization according to some example embodiments. Referring to FIG. 1, a semiconductor substrate 10 divided into a first region and a second region may be provided. The first region may be a cell region in which memory cells are formed and the second region may be a peripheral region in which peripheral circuits are formed. The semiconductor substrate 10 may be, for example, a single crystalline substrate.

On the semiconductor substrate 10, first, second, third, fourth and fifth thin layer patterns 12a, 12b, 12c, 12d and 12e may be formed to manufacture an integrated structure 12. The first to fifth thin layer patterns 12a, 12b, 12c, 12d and 12e may be formed by integrating thin layers using different kinds of materials. According to some example embodiments, two or more thin layers may be alternately integrated to form the integrated structure 12. On the thin layers, an upper insulating interlayer (not illustrated) and a first stopping layer (not illustrated) may be formed. The thin layers, the upper insulating interlayer and the first stopping layer may be patterned to remove layers formed on the substrate in the second region. The integrated structure 12 including the first to fifth thin layer patterns 12a, 12b, 12c, 12d and 12e, an upper insulating interlayer pattern 14 and a first stopping layer pattern 16 may be formed in the first region of the substrate 10.

The upper insulating interlayer 14 may be formed using, for example, a silicon oxide. The first stopping layer pattern 16 may be a polish stopping layer to prevent or reduce removal of the underlying integrated structure 12 during a polish process. The first stopping layer pattern 16 may be formed using a material with polish selectivity to silicon oxide. According to example embodiments, the first stopping layer pattern 16 may be formed using, for example, polysilicon. The first stopping layer pattern 16 may be formed using, for example, silicon nitride.

A first insulating interlayer 18 covering the first stopping layer pattern 16 may be formed on the substrate 10. The first insulating interlayer 18 may be formed using, for example, a silicon oxide. An upper surface portion (B) of the first insulating interlayer 18 formed in the first region on the substrate 10 may be positioned higher than an upper surface portion (A) of the first insulating interlayer 18 formed in the second region on the substrate 10 because of the integrated structure 12 formed on the substrate 10 in the first region.

The upper surface portion (A) of the first insulating interlayer 18 formed in the second region may be formed to have a height the same as or higher than a bottom portion of the first stopping layer pattern 16. When the upper surface portion (A) of the first insulating interlayer 18 formed in the second region is lower than the bottom portion of the first stopping layer pattern 16, the height of the upper surface portion (A) of the first insulating interlayer 18 in the second region may be lower than the upper insulating layer pattern 14, thereby generating a dishing defect.

A height difference between the first insulating interlayer 18 formed in the second region and the bottom portion of the first stopping layer pattern 16 may be preferably about 2,000 Å or less. The upper surface portion (A) of the first insulating interlayer 18 formed in the second region may be positioned at the same plane as the bottom portion of the first stopping layer pattern 16.

On the first insulating interlayer 18 formed in the second region, a second stopping layer pattern (not illustrated) may be formed. The second stopping layer pattern may be formed to prevent or reduce polishing of the first insulating interlayer 18 formed in the second region during a planarization process with respect to the first insulating interlayer 18. The second stopping layer pattern may be formed so that an upper surface portion thereof may be positioned substantially in the same plane (e.g., at about the same level) as the first stopping layer pattern 16 to restrain the polishing of the first insulating interlayer 18 in each region by means of the first stopping layer pattern 16 and the second stopping layer pattern. The position of the upper surface portion of the first insulating interlayer 18 may be about the same as the bottom portion of the first stopping layer pattern 16.

When a height difference between the upper surface portion of the first insulating interlayer 18 in the second region and the bottom portion of the first stopping layer pattern 16 is about 2,000 Å or more, the upper surface portion of the first insulating interlayer 18 in the first and second regions may not be planarized even through performance of the polish process. A dishing defect may be generated.

Figure 2:
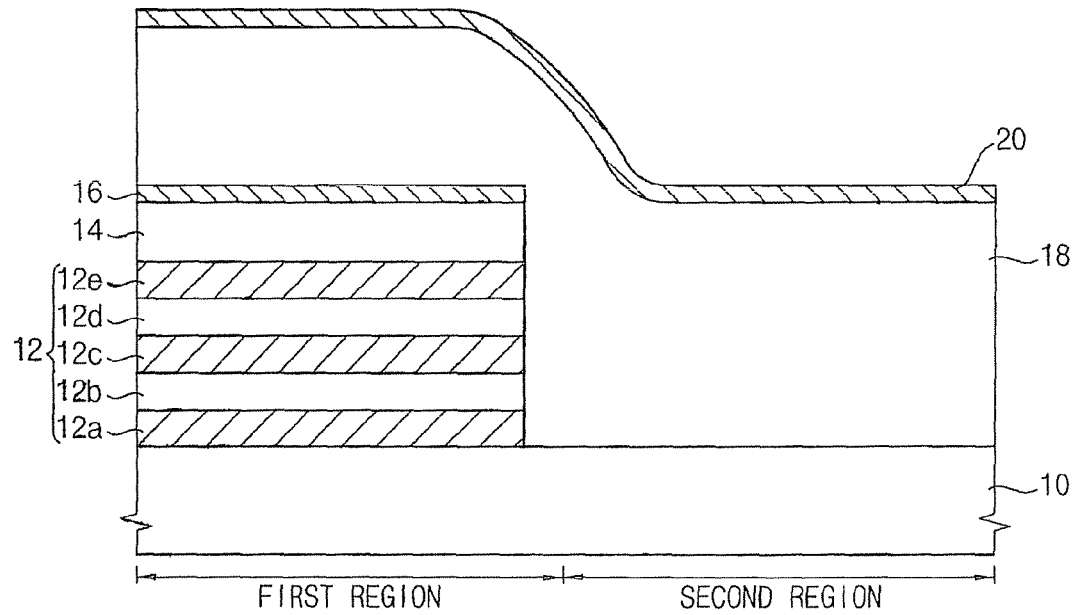

Referring to FIG. 2, a second stopping layer 20 may be formed on the first insulating interlayer 18. The second stopping layer 20 may be formed using a material having high and/or increased etch selectivity with respect to the first insulating interlayer 18. The second stopping layer 20 and the first stopping layer pattern 16 may be formed using different materials or using the same material. According to example embodiments, the second stopping layer 20 may be formed using a different material from the first stopping layer pattern 16 so that the process for forming the first stopping layer pattern 16 and the second stopping layer 20 may be controlled, respectively. The first stopping layer pattern 16 may be formed using, for example, polysilicon and the second stopping layer 20 may be formed using, for example, silicon nitride. A thickness difference between the second stopping layer 20 and the first stopping layer pattern 16 may be about 2,000 Å or less. The second stopping layer 20 and the first stopping layer pattern 16 may be formed, for example, to the same thickness.

Figure 3:
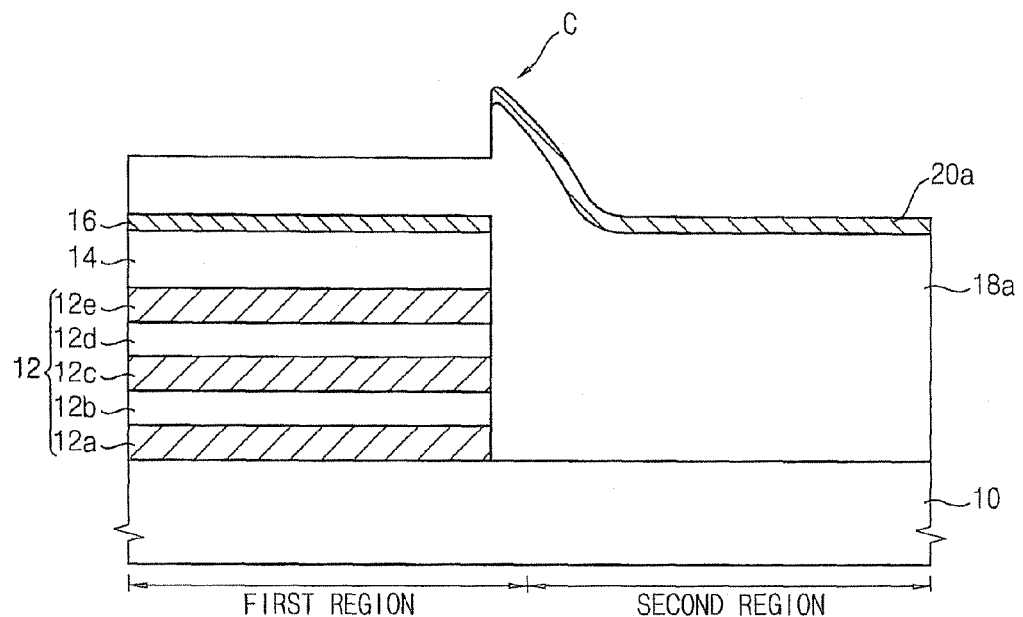

Referring to FIG. 3, a photoresist layer may be formed on the first insulating interlayer 18. The photoresist layer may be exposed and developed to form a photoresist pattern (not illustrated) exposing the first insulating interlayer 18 in the first region. The second stopping layer 20 in the cell region may be etched using the photoresist pattern as an etch mask. The first insulating interlayer 18 may be partially etched. A second preliminary stopping layer pattern 20a and a second preliminary insulating interlayer 18a may be formed, respectively.

While performing the etch process, the first insulating interlayer 18 may be etched so that an upper surface portion of the first stopping layer pattern 16 may not be exposed. The second preliminary insulating interlayer 18a formed through the etching process may have a step difference at the upper surface portion at a boundary of the first and second regions smaller than the step difference of the insulating interlayer 18. The second preliminary insulating interlayer 18a may include a protruded portion (C) at a boundary portion of the first and second regions.

Figure 4:
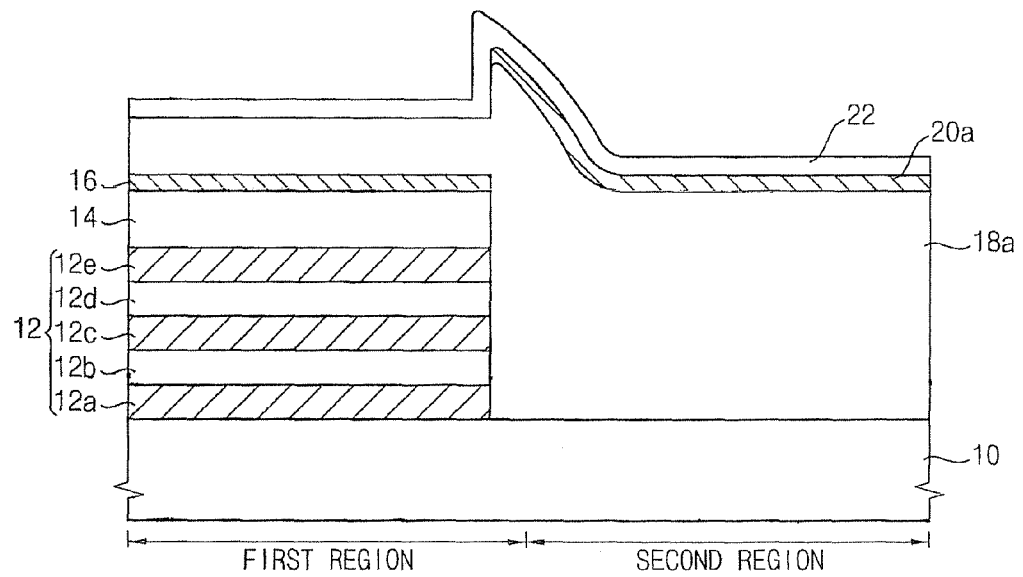

Referring to FIG. 4, a buffer layer 22 may be formed on the second preliminary insulating interlayer 18a and the second preliminary stopping layer pattern 20a. The buffer layer 22 may be formed using, for example, a silicon oxide. The process for forming the buffer layer 22 may be omitted for the sake of simplified processing.

Figure 5:
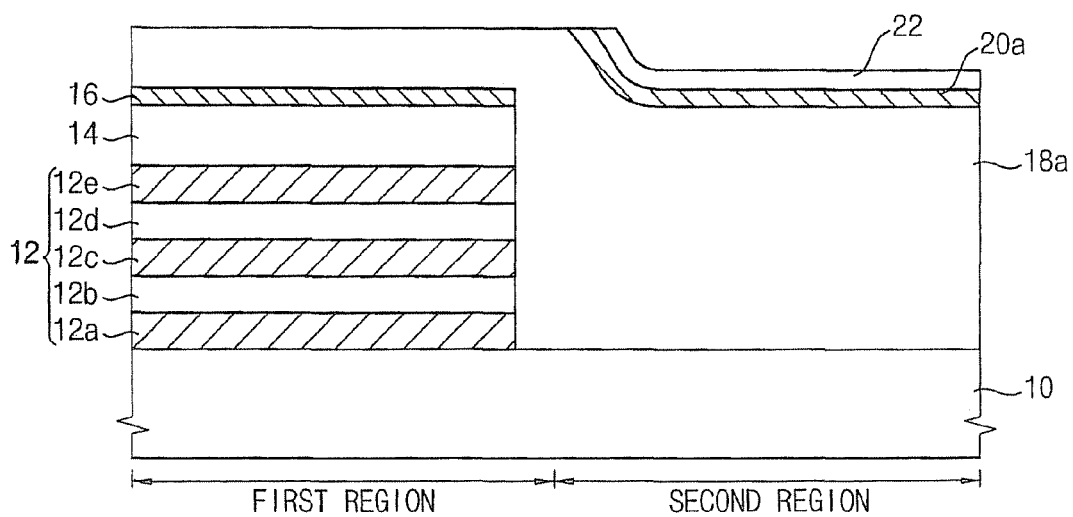

Referring to FIG. 5, in order to remove the protruded portion (FIG. 3, C) from the second preliminary insulating interlayer 18a at the boundary portion of the first and the second regions, a first polish process may be performed with respect to an upper surface portion of the buffer layer 22, the second stopping layer pattern 20a and the second preliminary insulating interlayer 18a. The first polish process may be preferably performed so as to rapidly remove the protruded portion (C) of the second preliminary insulating interlayer 18a. Through the first polish process, a portion of the buffer layer 22, the second preliminary stopping layer pattern 20a and the second preliminary insulating interlayer 18a may be removed. A height of the step difference formed at the upper portion of the layer formed at the first and second regions may be reduced.

Figure 6:
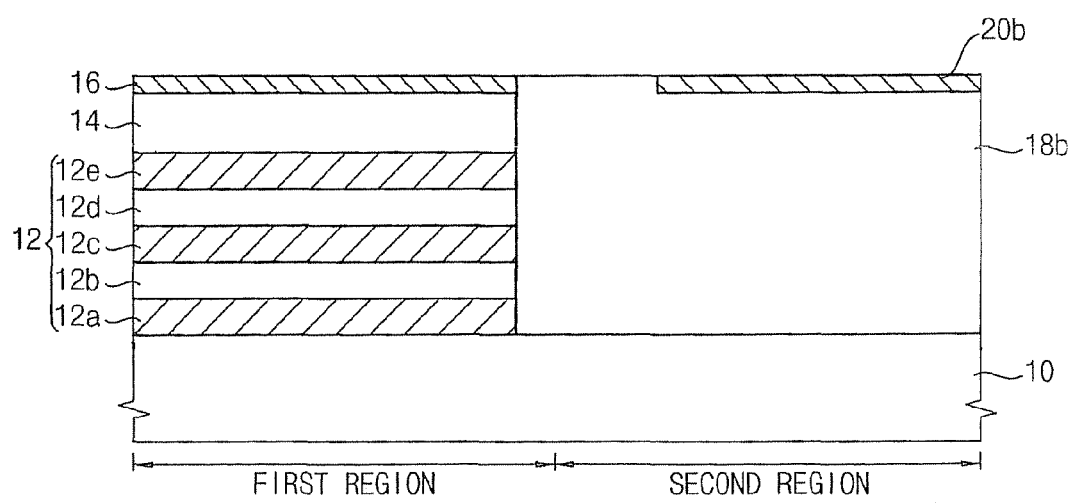

Referring to FIG. 6, after performing the first polish process, a second polish process may be performed with respect to the buffer layer 22, the second preliminary stopping layer pattern 20a and the second preliminary insulating interlayer 18a to obtain a planarized upper surface portion. The first stopping layer pattern 16 may be exposed at the upper surface portion in the first region and the second stopping layer pattern 20b may be exposed at the upper surface portion in the second region.

The second polish process may be performed using, for example, the same polish equipment used for performing the first polish process. The first and the second polish processes may be performed by employing different polish conditions from each other. The second polish process may be performed using a slurry different from that used for the first polish process. The second polish process may be performed using a slurry capable of stopping or slowing down the polish rate with respect to the first and second stopping layer patterns 16 and 20b. After performing the second polish process, the second preliminary insulating interlayer 18a formed in the first region may be removed; however, the second preliminary insulating interlayer 18b formed in the second region may remain. The upper surface portion of the second insulating interlayer 18b may be positioned nearly in the same plane as the upper surface portion of the upper insulating layer pattern 14.

The second stopping layer pattern 20b may stop the polishing to prevent or reduce the polishing of the second insulating interlayer 18b positioned in the second region and to restrain the generation of dishing while performing the second polish process. The first stopping layer pattern 16 may stop or reduce the polishing to prevent or reduce the generation of a defect while performing the second polishing process.

Figure 7:
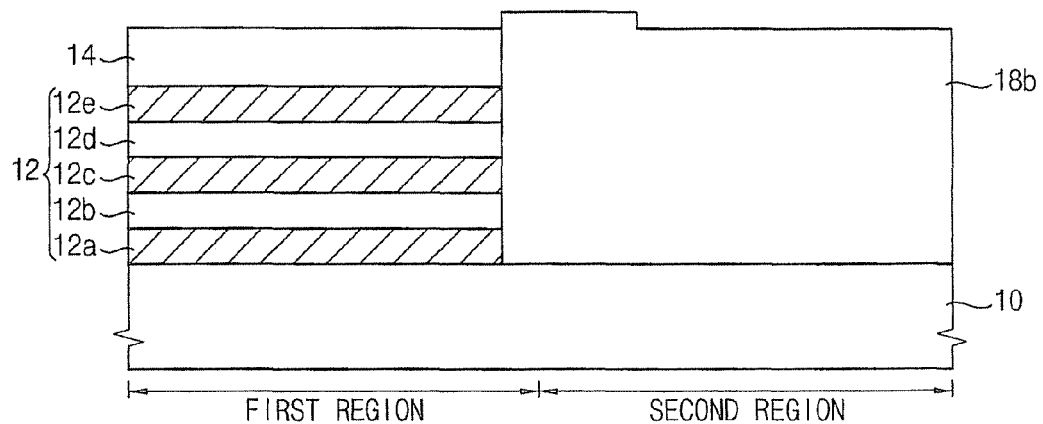

Referring to FIG. 7, the first and second stopping layer patterns 16 and 20b may be removed through an etch process. To prevent or reduce damage of the upper insulating layer pattern 14 and the second insulating interlayer 18b, the etch process may be, for example, a wet etch process. After performing the etch process, the upper insulating layer pattern 14 may be exposed in the first region and the second insulating interlayer 18b may be exposed in the second region. The upper insulating layer pattern 14 and the second insulating interlayer 18b may have nearly planar upper surface portions.

As described above, the insulating interlayer covering the underlying first region including the integrated structure and covering the second region excluding the integrated structure may have a planar upper surface portion. Because a step difference may be barely formed at the upper surface portion of the insulating interlayer, a generation of a dishing defect may be reduced and a residue defect generated near the step difference may be prevented or reduced. The residue defect may be generated due to a residual layer remaining near the step difference portion after performing the polish process.

Figure 8:
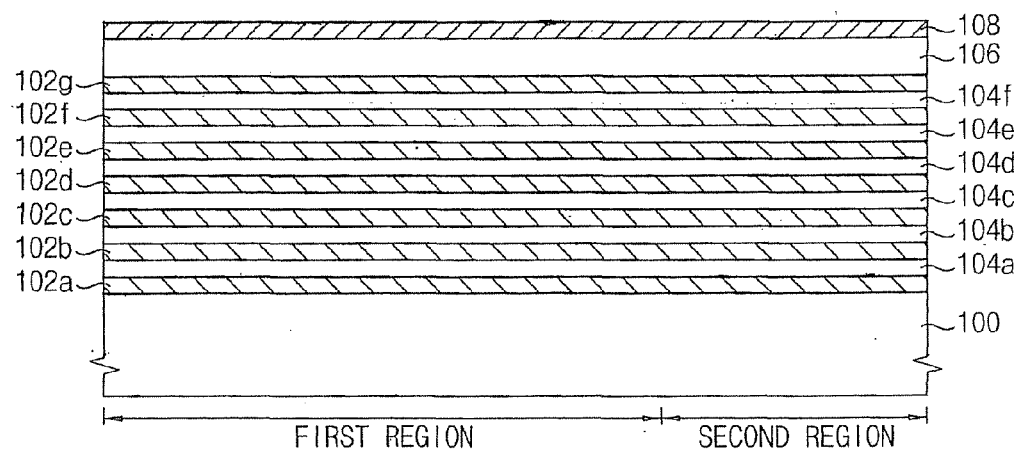

FIGS. 8-15 are cross-sectional diagrams illustrating methods of manufacturing vertical type semiconductor devices according to other example embodiments. Referring to FIG. 8, a substrate 100 divided into a first region and a second region may be provided. On the substrate 100 in the first region, vertically integrated memory cells may be formed. The substrate 100 may be formed using, for example, single crystalline silicon.

A pad oxide layer (not illustrated) may be formed on the substrate 100. On the pad oxide layer, sacrificial layers and insulating layers may be subsequently and alternately formed. For example, first, second, third, fourth, fifth, sixth and seventh sacrificial layers 102a, 102b, 102c, 102d, 102e, 102f and 102g and first, second, third, fourth, fifth and sixth insulating layers 104a, 104b, 104c, 104d, 104e and 104f may be formed in an alternating manner. The first, second, third, fourth, fifth, sixth and seventh sacrificial layers 102a, 102b, 102c, 102d, 102e, 102f and 102g may be formed using, for example, silicon nitride and the first, second, third, fourth, fifth and sixth insulating layers 104a, 104b, 104c, 104d, 104e and 104f may be formed using, for example, silicon oxide.

On the seventh sacrificial layer 102g, an upper insulating layer 106 and a first stopping layer 108 may be formed. The thickness of the upper insulating layer 106 may be greater than thicknesses of the underlying first, second, third, fourth, fifth and sixth insulating layers 104a, 104b, 104c, 104d, 104e and 104f. The first stopping layer 108 may be formed using a material with polish selectivity with respect to, for example, silicon oxide. The first stopping layer 108 may be formed using, for example, polysilicon in accordance with at least one example embodiment. The first stopping layer 108 may be formed using, for example, silicon nitride.

Figure 9:
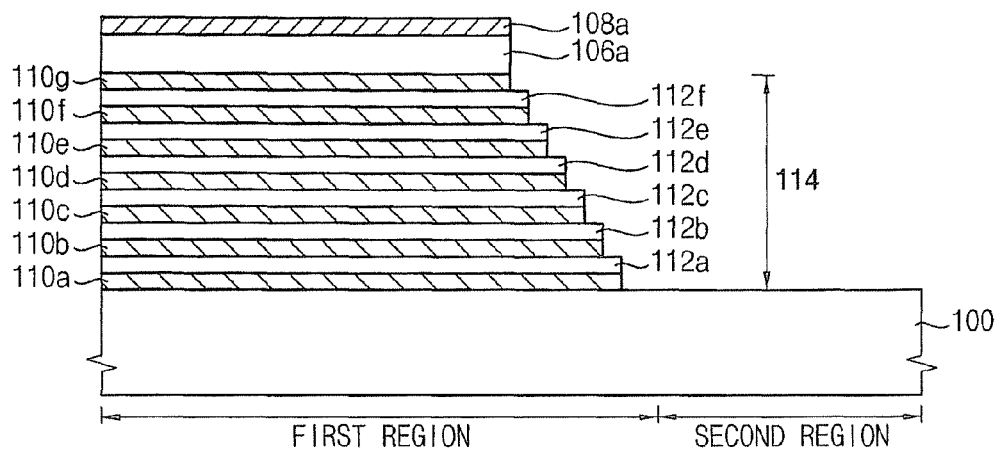

Referring to FIG. 9, a first stopping layer pattern 108a may be formed by patterning the first stopping layer 108 using, for example, photolithography and etch processes. The upper insulating layer 106 may be etched to form an upper insulating layer pattern 106a. A portion of the first, second, third, fourth, fifth, sixth and seventh sacrificial layers 102a, 102b, 102c, 102d, 102e, 102f and 102g, and the first, second, third, fourth, fifth and sixth insulating layers 104a, 104b, 104c, 104d, 104e and 104f may be etched to form a mold structure 114 including integrated layers of first, second, third, fourth, fifth, sixth and seventh sacrificial layer patterns 110a, 110b, 110c, 110d, 110e, 110f and 110g and first, second, third, fourth, fifth and sixth insulating layer patterns 112a, 112b, 112c, 112d, 112e and 112f on the substrate 100 in the first region.

The mold structure 114 may be formed only in the first region on the substrate 100. A sidewall edge portion of the first, second, third, fourth, fifth, sixth and seventh sacrificial layer patterns 110a, 110b, 110c, 110d, 110e, 110f and 110g and the first, second, third, fourth, fifth and sixth insulating layer patterns 112a, 112b, 112c, 112d, 112e and 112f included in the mold structure 114 may have a stair shape. The underlying first, second, third, fourth, fifth and sixth sacrificial layer patterns 110a, 110b, 110c, 110d, 110e and 110f and the underlying first, second, third, fourth and fifth insulating layer patterns 112a, 112b, 112c, 112d and 112e may have a larger size than the higher positioned second, third, fourth, fifth, sixth and seventh sacrificial layer patterns 110b, 110c, 110d, 110e, 110f and 110g and the upper positioned second, third, fourth, fifth and sixth insulating layer patterns 112b, 112c, 112d, 112e and 112f, respectively. The length of the first, second, third, fourth, fifth, sixth and seventh sacrificial layer patterns 110a, 110b, 110c, 110d, 110e, 110f and 110g and the first, second, third, fourth, fifth and sixth insulating layer patterns 112a, 112b, 112c, 112d, 112e and 112f may be gradually reduced from the bottom portion to the upper portion of the mold structure 114.

Figure 10:
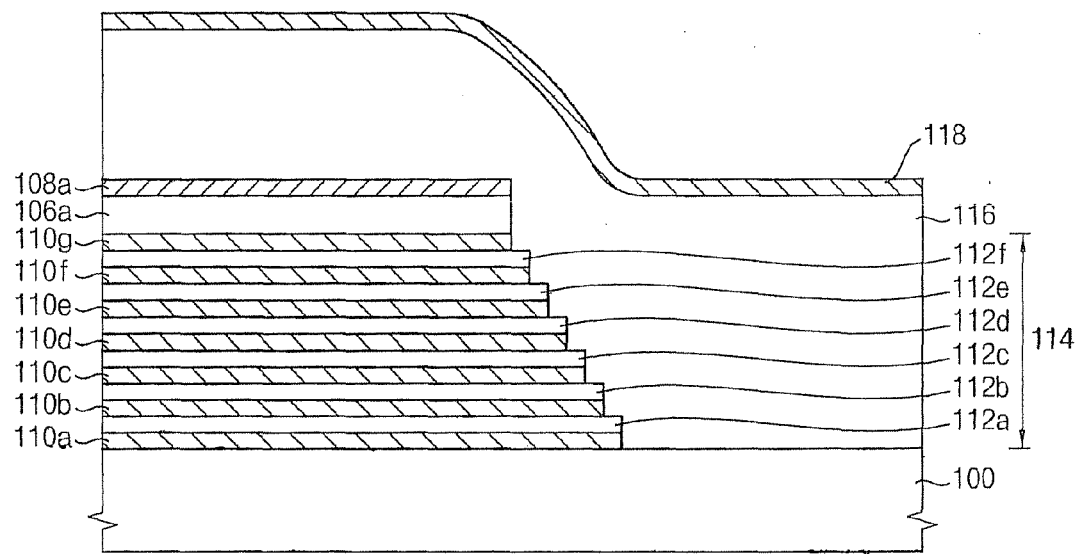

Referring to FIG. 10, a first insulating interlayer 116 covering the first stopping layer pattern 108a and a second stopping layer 118 covering the first insulating interlayer 116 may be formed on the substrate 100. The first insulating interlayer 116 may be formed using, for example, silicon oxide. Because the mold structure 114 may be integrated on the substrate 100 in the first region, the upper surface portion of the first insulating interlayer 116 formed on the substrate 100 in the first region may be positioned higher than the upper surface portion of the first insulating interlayer 116 formed on the substrate 100 in the second region.

The upper surface portion of the first insulating interlayer 116 formed in the second region may be provided at about the same position as or at a higher position than a bottom portion of the first stopping layer pattern 108a. A height difference between the upper surface portion of the first insulating interlayer 116 formed in the second region and the bottom portion of the first stopping layer pattern 108a may be about 2,000 Å or less. An upper surface portion of the second stopping layer 118 in the second region and the upper surface portion of the first stopping layer pattern 108a may be substantially in the same plane. The upper surface portion of the first insulating interlayer 116 and the bottom portion of the first stopping layer pattern 108a may be positioned in the same plane.

Figure 11:
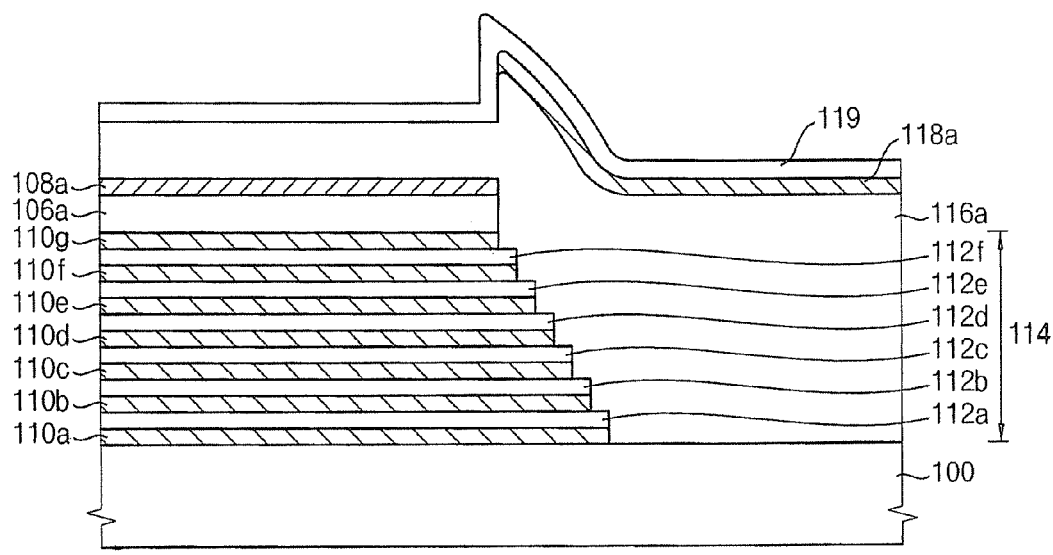

Referring to FIG. 11, a photoresist layer may be formed on the first insulating interlayer 116 and then, exposed and developed to form in a photoresist pattern (not illustrated) exposing the first insulating interlayer 116 in the first region. The second stopping layer 118 positioned in the first region, particularly in the cell region may be etched using the photoresist pattern as a mask. The first insulating interlayer 116 may be partially etched. After performing the etch process, a second preliminary stopping layer pattern 118a and a second preliminary insulating interlayer 116a may be respectively formed.

According to the etch process, the size of the step difference of the upper surface portion of the second preliminary insulating interlayer 116a in the first and second regions may be reduced. The second preliminary insulating interlayer 116a may include a protruded portion at a boundary portion of the first and second regions. A buffer layer 119 may be formed on the second preliminary insulating interlayer 116a and the second preliminary stopping layer pattern 118a.

Figure 12:
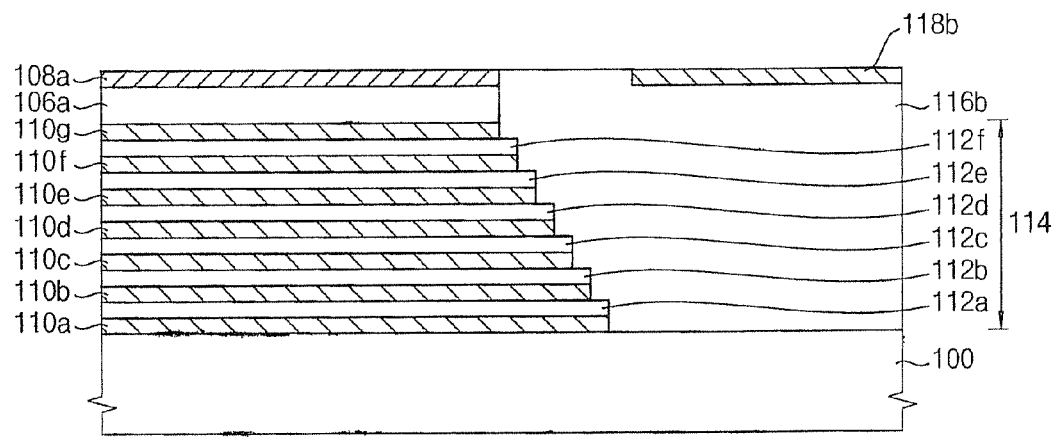

Referring to FIG. 12, a first polish process may be performed with respect to upper surface portions of the buffer layer 119, the second preliminary stopping layer pattern 118a and the second preliminary insulating interlayer 116a to remove the protruded portion in the second preliminary insulating interlayer 116a at the boundary portion of the first and second regions. The first polish process may be performed using a process for rapidly removing the protruded portion of the thin layer. Through the first polish process, the size of the step difference of the upper surface portion of the layer formed in the first and second regions may be reduced.

After performing the first polish process, a second polish process may be performed with respect to the buffer layer 119, the second preliminary stopping layer pattern 118a and the second preliminary insulating interlayer 116a to obtain planarized upper surface portions. The first stopping layer pattern 108a may be exposed at the upper surface portion in the first region and the second stopping layer pattern 118b may be exposed at the upper surface portion in the second region. After performing the first and second polish processes, a second insulating interlayer 116b with a nearly planar upper surface portion may be formed.

The second polish process may be performed using, for example, the same polish equipment for performing the first polish process. Polishing conditions of the first and second polish processes may be different from each other. The second polish process may be performed using a slurry different from that used for performing the first polish process. The second polish process may be performed using a slurry stopping or slowing down the polish rate at the first and second stopping layer patterns 108a and 118b. The upper surface portion of the second insulating interlayer 116b formed after performing the second polish process may be positioned in about the same plane as the upper surface portion of the upper insulating layer pattern 106a. While performing the second polish process, generation of dishing through polish of the second insulating interlayer 116b in the second region may be prevented or reduced due to the second stopping layer pattern 118b.

Figure 13:
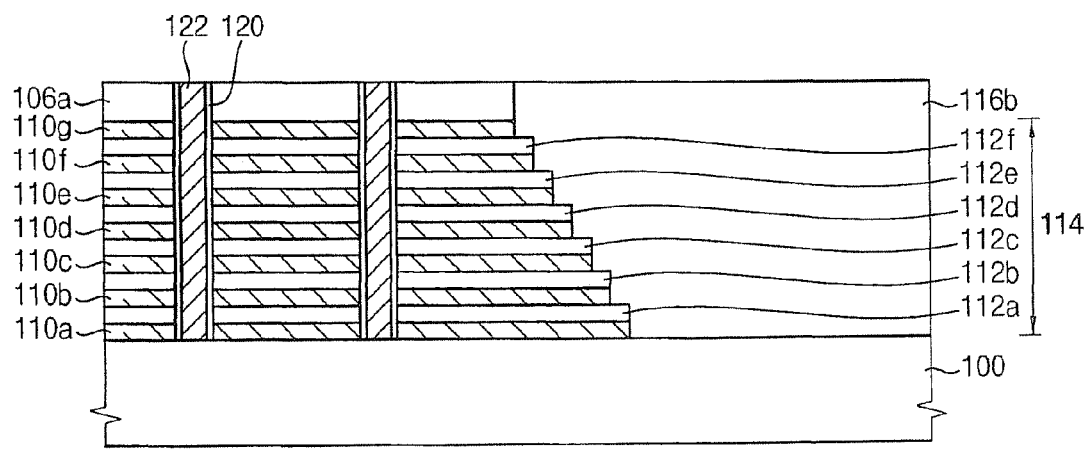

Referring to FIG. 13, the first and second stopping layer patterns 108a and 118b may be removed by performing an etch process. In order to prevent or reduce damage of the upper insulating interlayer 106a and the second insulating interlayer 116b, the etching process may be performed as, for example, a wet etch process. An etch mask pattern (not illustrated) for forming channel holes may be formed on the upper insulating layer pattern 106a and the second insulating interlayer 116b. The channel holes may be formed in the first region, that is, in the cell region. The underlying insulating layers and sacrificial layers may be etched using the etch mask pattern as an etch mask to form a plurality of channel holes. Through bottom portions of the channel holes, a surface portion of the substrate 100 may be exposed. The channel holes may be arranged, for example, in a row and/or diagonally staggered.

On surface portions of sidewalls of the channel holes, a thin layer structure 120 formed by integrating a blocking dielectric layer, a charge storing layer and a tunnel insulating layer may be formed. The blocking dielectric layer, the charge storing layer and the tunnel insulating layer may be formed, for example, as an ONO (oxide/nitride/oxide) structure obtained by integrating silicon oxide, silicon nitride and silicon oxide. The blocking dielectric layer may be formed, for example, using a metal oxide with high dielectricity and the charge storing layer and the tunnel insulating layer may be formed using, for example, silicon nitride and silicon oxide, respectively.

In order to completely fill up the channel holes including the blocking dielectric layer, the charge storing layer and the tunnel insulating layer on the sidewalls, a semiconductor material layer may be formed. The semiconductor material layer may include, for example, a polysilicon layer. The polysilicon layer may contact the surface portion of the substrate 100 at the bottom portion of the channel holes. The polysilicon layer may be polished to expose the upper surface portion of the upper insulating layer pattern 106a and to form a channel layer pattern 122 in the channel hole.

The planarity of the upper insulating layer pattern 106a and the second insulating interlayer pattern 116b in the first and second regions may be high and dishing may be barely generated. Generation of a residue defect may be prevented or reduced while performing a polish process with respect to the polysilicon layer. The residue defect may be generated when the polysilicon layer remains on the upper surface portion of the upper insulating layer pattern 106a and the second insulating interlayer pattern 116b.

Figure 14:
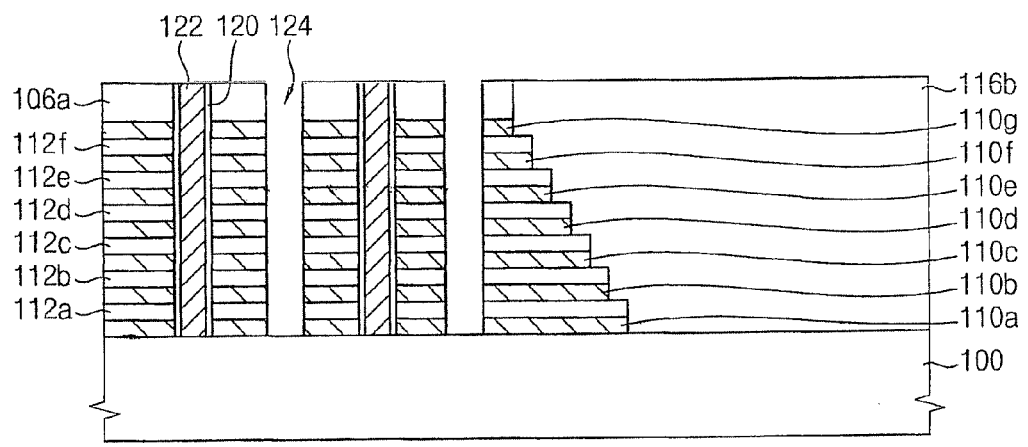

Referring to FIG. 14, an opening portion 124 may be formed by etching the upper insulating layer pattern 106a and the mold structure 114 between the channel layer patterns 122 arranged in a row. The opening portion 124 may be trench shaped and may extend in one direction. The opening portion 124 may be formed by, for example, etching the mold structure 114 until the surface portion of the substrate 100 is exposed.

Figure 15:
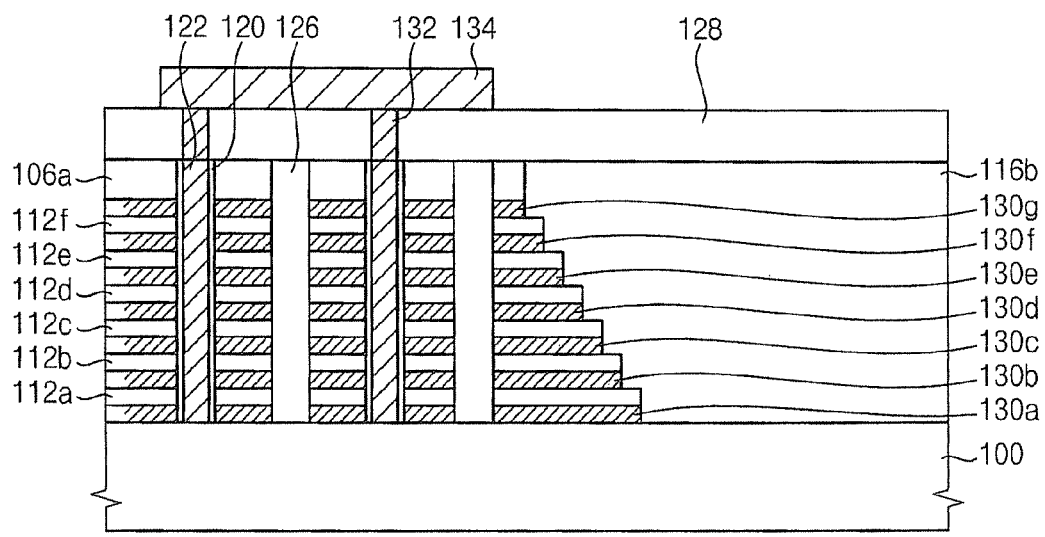

Referring to FIG. 15, after forming the opening portion 124, the first, second, third, fourth, fifth, sixth and seventh sacrificial layer patterns 110a, 110b, 110c, 110d, 110e, 110f and 110g exposed through the sidewall portion of the opening portion 124 may be removed to form grooves. A conductive layer (not illustrated) may be formed within the grooves and the opening portion 124. The conductive layer may be formed by depositing a conductive material with a good step coverage characteristic to restrain generation of voids. The conductive material may include, for example, a metal. The conductive material may include a material with low electrical resistance, for example, tungsten, tungsten nitride, titanium, titanium nitride, tantalum, tantalum nitride, platinum, and the like. A barrier metal layer including titanium, titanium nitride, tantalum and/or tantalum nitride, may be formed and then, a metal layer using tungsten may be formed.

The conductive layer formed within the opening portion 124 may be etched. The conductive layer in the opening portion 124 may be removed but may remain in the grooves to form first, second, third, fourth, fifth, sixth and seventh control gate electrodes 130a, 130b, 130c, 130d, 130e, 130f and 130g. The removing process may be performed using, for example, a wet etch process. The sidewall edge portion of the first, second, third, fourth, fifth, sixth and seventh control gate electrodes 130a, 130b, 130c, 130d, 130e, 130f and 130g may be stair shaped. The sidewall edge portion may be used as, for example, a pad for connecting word lines.

Into the substrate 100 at the bottom portion of the opening portion 124 formed after etching the conductive layer, impurities may be doped to form an impurity doped region (not illustrated). For example, n-type impurities may be doped to form the impurity doped region used as a source line. In order to reduce resistance of the source line, a metal suicide pattern (not illustrated) may be aimed on the impurity doped region.

An insulating layer filling up the opening portion 124 may be formed and then planarized by means of a polish process to form an insulating layer pattern 126. A third insulating interlayer 128 covering structures including the channel layer pattern 126 and the first, second, third, fourth, fifth, sixth and seventh control gate electrodes 130a, 130b, 130c, 130d, 130e, 130f and 130g may be formed. A bit line contact 132 penetrating the third insulating interlayer 128 and making a contact with an upper surface portion of the channel layer pattern 122 may be formed. Further, bit lines 134 making a contact with an upper surface portion of the bit line contact 132 may be formed. The bit lines 134 may be line shaped, extend in one direction and make electrical contact with the channel layer patterns 122.

A contact plug (not illustrated) and connecting lines (not illustrated) for respectively connecting to the first, second, third, fourth, fifth, sixth and seventh control gate electrodes 130a, 130b, 130c, 130d, 130e, 130f and 130g at each layer may be formed.

A vertical type nonvolatile memory device manufactured according to example embodiments may include an insulating interlayer with a planar shape across a portion including an underlying integrated structure and a portion excluding an underlying integrated structure. A step difference may be barely generated at an upper surface portion of each region of the insulating interlayer, and a dishing defect may be prevented or reduced. Generation of a residue defect due to locally remaining layer after performing a polish process may be reduced. A high performance vertical type nonvolatile memory may be manufactured.

Figure 16:
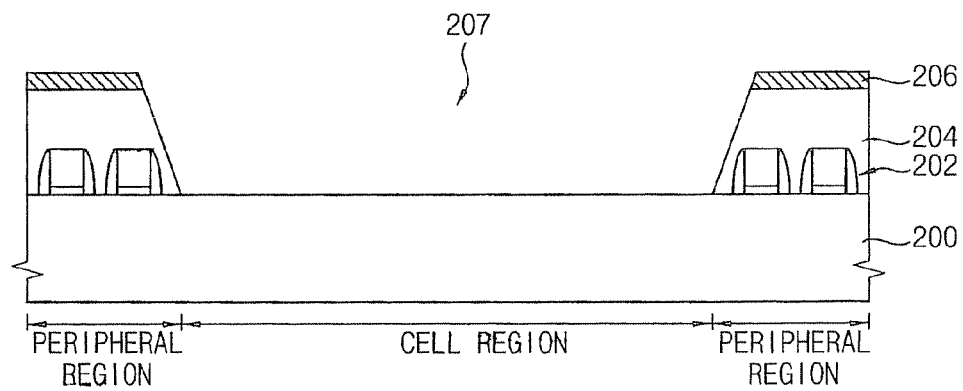

FIGS. 16-22 are across-sectional views illustrating methods of manufacturing vertical type semiconductor devices according to further example embodiments. Referring to FIG. 16, a semiconductor substrate 200 including a cell region and peripheral regions may be provided. In the cell region, memory cells may be formed and in the peripheral region, peripheral circuits may be formed. The semiconductor substrate 200 may be, for example, a single crystalline silicon substrate. On the substrate 200 in the peripheral regions, unit devices forming peripheral circuits may be formed. The unit devices may include transistors 202 and contact plugs (not illustrated).

On the substrate 200, a first insulating interlayer 204 covering the unit devices may be formed. The first insulating interlayer 204 may be formed by depositing, for example, a silicon oxide. An upper surface portion of the first insulating interlayer 204 may be planarized. The planarization may be performed through, for example, a chemical mechanical planarization process or an etch back process. On the first insulating interlayer 204, a first stopping layer 206 may be formed. The first stopping layer 206 may be formed using, for example, silicon nitride. On the first stopping layer 206, an etch mask pattern (not illustrated) covering the peripheral regions may be formed. The etch mask pattern may be, for example, a photoresist pattern. The first stopping layer 206 and the first insulating interlayer 204 may be etched using the etch mask pattern to form an opening 207 that exposes an upper surface portion of the substrate 200 in the cell region. Through performing the etch process, an entire surface portion of the substrate 200 in the cell region may be exposed.

Figure 17:
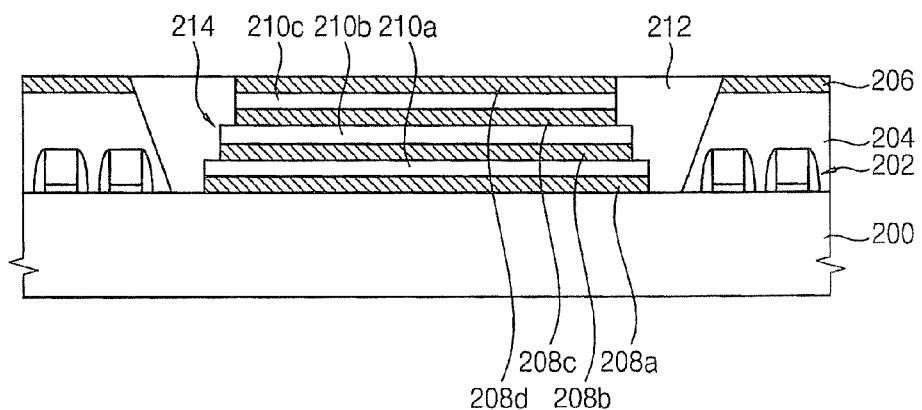

Referring to FIG. 17, a pad oxide layer (not illustrated) may be formed on the substrate 200 in the cell region. On the pad oxide layer, first, second, third and fourth sacrificial layers (not illustrated) and first, second and third insulating layers (not illustrated) may be alternately and repeatedly formed. The first to fourth sacrificial layers and the first to third insulating layers may fill up the opening 207 formed in the cell region. The position of the uppermost layer, that is, the fourth sacrificial layer in the cell region, may be the same as the position of the first etch stopping layer 206 and the two layers may have the same height from the surface portion of the substrate 200. The sacrificial layers may be formed using, for example, a silicon nitride and the insulating layers may be formed using, for example, a silicon oxide.

A portion of the first to fourth sacrificial layers and the first to third insulating layers may be subsequently patterned to form first, second, third and fourth sacrificial layer patterns 208a, 208b, 208c and 208d, and first, second and third insulating interlayer patterns 210a, 210b and 210c and to form a first preliminary mold structure 214 including integrated patterns of the first, second, third and fourth sacrificial layer patterns 208a, 208b, 208c and 208d and the first, second and third insulating interlayer patterns 210a, 210b and 210c on the substrate 200 in the cell region. A sidewall edge portion of the first, second, third and fourth sacrificial layer patterns 208a, 208b, 208c and 208d and the first, second and third insulating interlayer patterns 210a, 210b and 210c included in the first preliminary mold structure 214 may form a stair shape.

An insulating material layer 212 covering the first preliminary mold structure 214 and filling up an opening portion between the sidewall portion of the first preliminary mold structure and the first insulating interlayer 204 and the first stopping layer 206 may be formed. The insulating material layer 212 may be polished to expose an upper surface portion of the uppermost layers of the first stopping layer 206 and the fourth sacrificial layer pattern 208d. While performing the polish process, the polish rate may be slowed down or stopped at the first stopping layer 206. The circuit patterns formed in the peripheral regions may not be damaged by the polish process.

Figure 18:
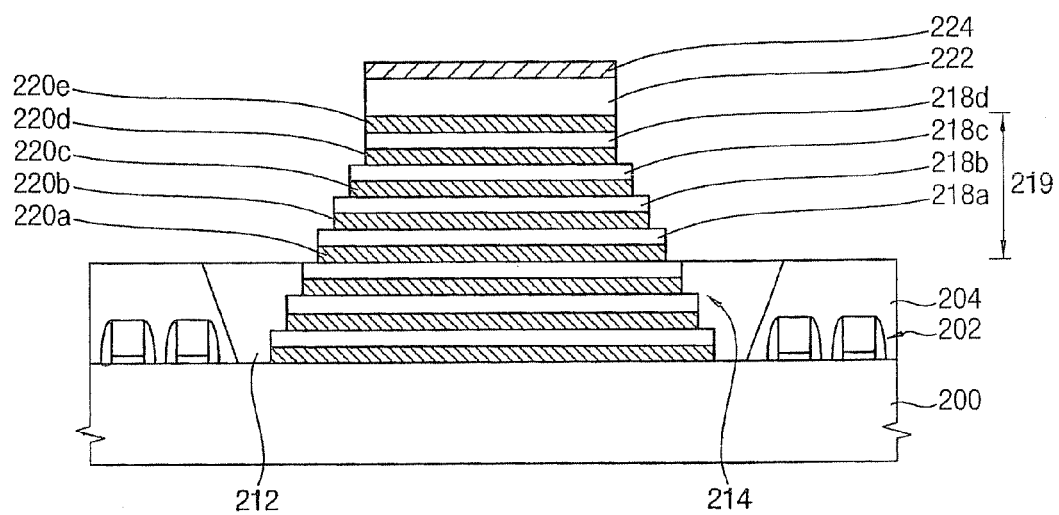

Referring to FIG. 18, the first stopping layer 206 and the fourth sacrificial layer pattern 208d may be removed through an etch process. After performing the etch process, further sacrificial layers and insulating layers may be alternately and repeatedly formed on the third insulating pattern 210c, the insulating material layer 212 and the first insulating interlayer 204 to form a second preliminary mold structure (not illustrated). The second preliminary mold structure may include alternately formed fifth, sixth, seventh, eighth and ninth sacrificial layers (not illustrated) and fourth, fifth, sixth and seventh insulating layers (not illustrated). On the ninth sacrificial layer, an upper insulating layer (not illustrated) and a second stopping layer (not illustrated) may be formed. The second stopping layer may be formed using a material with polish selectivity to, for example, a silicon oxide. The second stopping layer may be formed using, for example, polysilicon. Alternatively, the second stopping layer may be formed using silicon nitride.

The second stopping layer and the upper insulating layer may be patterned to form a second stopping layer pattern 224 and an upper insulating layer pattern 222. The second preliminary mold structure may be patterned to form a second mold structure 219 on the first mold structure 214. The second mold structure 219 may include fifth, sixth, seventh, eighth and ninth sacrificial layer patterns 220a, 220b, 220c, 220d and 220e and fourth, fifth, sixth and seventh insulating layer patterns 218a, 218b, 218c and 218d. Sidewall edge portions of the fifth, sixth, seventh, eighth and ninth sacrificial layer patterns 220a, 220b, 220c, 220d and 220e and fourth, fifth, sixth and seventh insulating layer patterns 218a, 218b, 218c and 218d may form a stair shape.

An area of the first, second and third sacrificial layer patterns 208a, 208b and 208c and the first, second and third insulating layer patterns 210a, 210b and 210c may be greater than an area of the fifth, sixth, seventh, eighth and ninth sacrificial layer patterns 220a, 220b, 220c, 220d and 220e and the fourth, fifth, sixth and seventh insulating layer patterns 218a, 218b, 218c and 218d. The sidewall edge portion of the first and second mold structures 214 and 219 may be stair shapes, as illustrated in FIG. 18.

Figure 19:
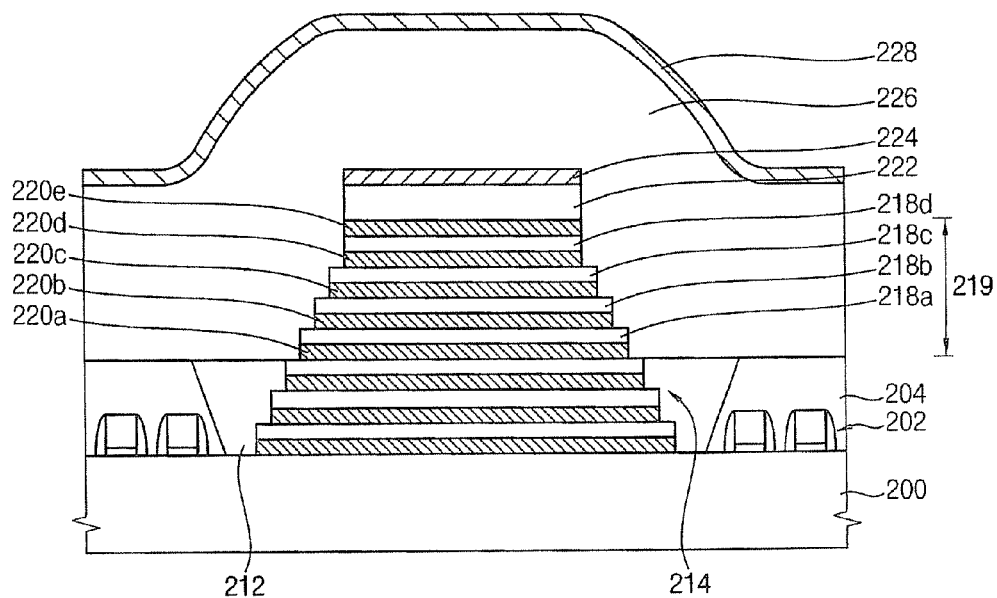

Referring to FIG. 19, a second insulating interlayer 226 covering the second mold structure 219, the first insulating interlayer 204 and the insulating material layer 212 may be formed. An upper surface portion of the second insulating interlayer 226 provided on the first insulating interlayer 204 may be positioned in the same plane (e.g., the same level) as or higher than a bottom portion of the second stopping layer pattern 224. A height difference between the upper surface portion of the second insulating interlayer 226 provided on the first insulating interlayer 204 and an upper surface portion of the second stopping layer pattern 224 may be about 2,000 Å or less. The upper surface portion of the second insulating interlayer 226 provided on the first insulating interlayer 204 and the upper surface portion of the second stopping layer pattern 224 may be positioned in the same plane.

A third stopping layer 228 may be formed on the second insulating interlayer 226. The third stopping layer 228 may be formed using a material with high etch selectivity to the second insulating interlayer 226. The third stopping layer 228 may be formed using the same material as the second stopping layer pattern 224 or using a different material from the second stopping layer pattern 224. The second stopping layer pattern 224 may be formed using, for example, polysilicon and the third stopping layer 228 may be formed using, for example, silicon nitride. A thickness difference between the third stopping layer 228 and the second stopping layer pattern 224 may be less than about 2,000 Å. The third stopping layer 228 and the second stopping layer pattern 224 may be formed to the same thickness.

Figure 20:
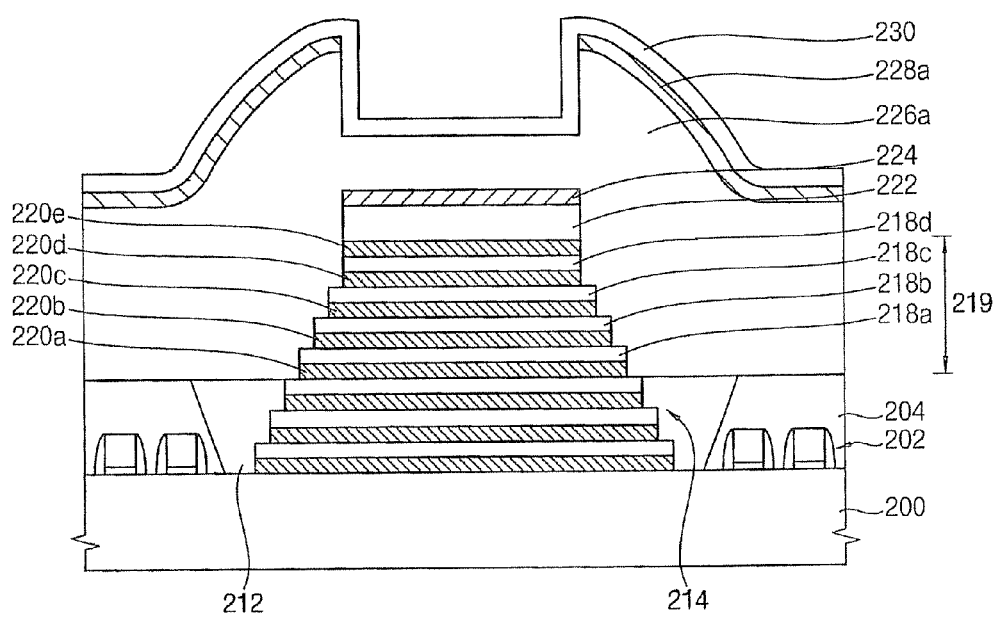

Referring to FIG. 20, a photoresist pattern (not illustrated) exposing the second insulating interlayer 226 in the cell region may be formed on the second insulating interlayer 226. The third stopping layer 228 formed in the cell region may be etched and the second insulating interlayer 226 may be partially etched using the photoresist pattern as a mask. A third preliminary stopping layer pattern 228a and a third preliminary insulating interlayer 226a may be respectively formed. The third preliminary insulating interlayer 226a formed by partially etching the second insulating interlayer 226 may have protruded portions at boundary regions of the cell region and the peripheral regions. While performing the etch process, the upper surface portion of the second stopping layer pattern 224 may not be exposed. A buffer layer 230 may be formed on the third preliminary insulating interlayer 226a. The buffer layer 230 may be formed using, for example, a silicon oxide.

Figure 21:
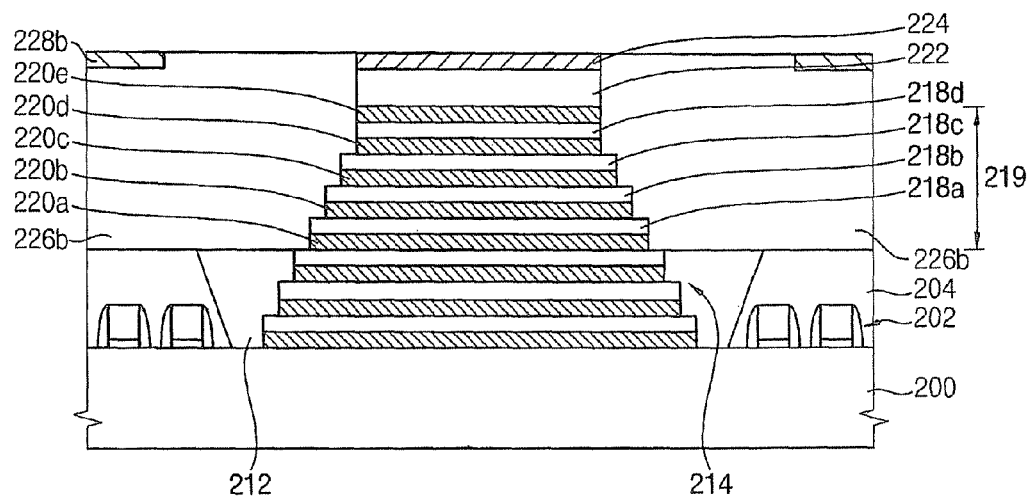

Referring to FIG. 21, a first polish process may be performed with respect to the buffer layer 230, the third preliminary stopping layer pattern 228a and the upper surface portion of the third preliminary insulating interlayer 226a to remove the protruded portions from the third preliminary insulating interlayer 226a at the boundary portions of the cell region and the peripheral regions. The first polish process may be performed so that the protruded portions from the thin layers may be rapidly removed. After performing the first polish process, a size of the protruded step difference formed at the boundary portion of the cell region and the peripheral regions may be reduced.

After performing the first polish process, a second polish process may be performed with respect to the buffer layer 230, the third preliminary stopping layer pattern 228a and the third preliminary insulting interlayer 226a to obtain planarized upper surface portions. Through the second polish process, a third stopping layer pattern 228b may be formed at an upper surface portion in the peripheral region. The second stopping layer pattern 224 may be exposed through the upper surface portion in the cell region and the third stopping layer pattern 228b may be exposed through the upper surface portion in the peripheral region.

The second polish process may be performed using, for example, the same polish equipment used for performing the first polish process. The first polish and the second polish may be performed under different processing conditions. The second polish process may be performed using a slurry with a property of stopping or slowing down the polish at the second and third stopping layer patterns 224 and 228b. After performing the second polish process, the upper surface portion of a third insulating interlayer 226b formed in the cell region and the peripheral region may be positioned nearly in the same plane as the upper surface portion of the upper insulating layer 222. Because of the third stopping layer pattern 228b, generation of dishing through polishing of the third insulating interlayer 226b formed in the cell region and the peripheral region may be prevented or reduced.

Figure 22:
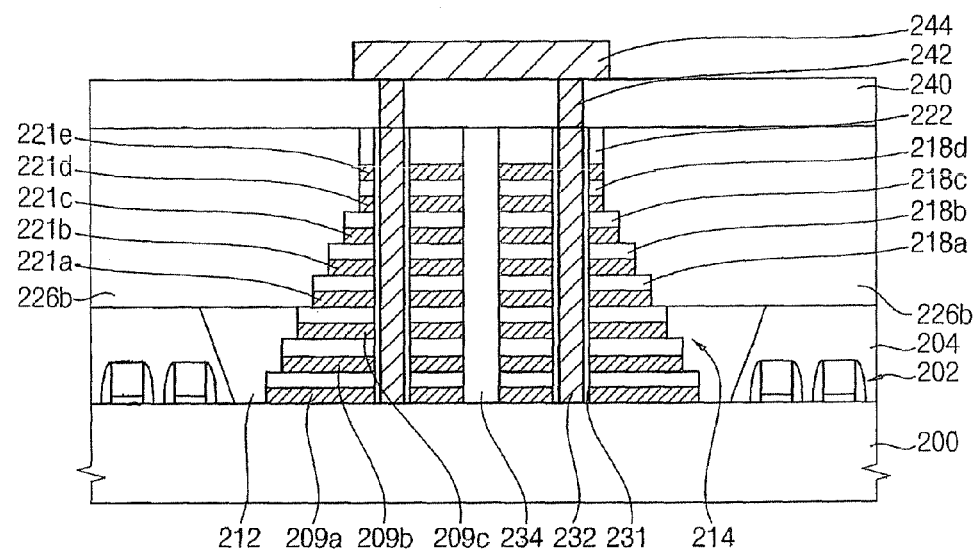

Referring to FIG. 22, the second and third stopping layer patterns 224 and 228b may be removed through an etch process. Underlying sacrificial layer patterns and insulating layer patterns may be etched to form a plurality of channel holes exposing a surface portion of the substrate 200. On surface portions of a sidewall of the channel holes, a thin layer structure 231 may be formed by integrating, for example, a blocking dielectric layer, a charge storing layer and a tunnel insulating layer.

A semiconductor material layer completely filling up an inner portion of the channel holes including the thin layer structure 231 may be formed and then polished to form a channel layer pattern 232. Through performance of the polish process, the planarity of the upper insulating layer 222 and the third insulating interlayer 226 in the cell and peripheral regions may be high and/or improved, and dishing may be barely generated. A residue defect may not be generated while performing the polishing with respect to the semiconductor material layer. The residue defect may refer to the semiconductor material layer that remains on an upper surface portion of the upper insulating layer 222 and the third insulating interlayer 226b.

The mold structure between the channel layer patterns 232 arranged in a row may be etched to form an opening portion exposing the surface of the substrate 200. The first, second, third, fifth, sixth, seventh, eighth and ninth sacrificial layer patterns 208a, 208b, 208c, 220a, 220b, 220c, 220d and 220e exposed through the sidewall of the opening portion may be removed to form grooves. Within the grooves, first, second, third, fourth, fifth, sixth, seventh and eighth control gate electrodes 209a, 209b, 209c, 221a, 221b, 221c, 221d and 221e may be formed. An insulating layer filling up the opening portion may be formed and then a polish process may be performed to planarize and to form insulating layer pattern 234.

On the channel layer pattern 232, the insulating layer pattern 234, the upper insulating layer 222 and the third insulating interlayer 226b, a fourth insulating interlayer 240 may be formed. A bit line contact 242 penetrating the fourth insulating interlayer 240 and making electrical contact with the upper surface portion of the channel layer pattern 232 and a bit line 244 may be formed. Contact plugs (not illustrated) and connecting lines (not illustrated) for connecting each of the first, second, third, fourth, fifth, sixth, seventh and eighth control gate electrodes 209a, 209b, 209c, 221a, 221b, 221c, 221d and 221e may be formed.

In accordance with example embodiments, peripheral circuits may not be damaged while performing the manufacturing process of the vertical type semiconductor device. A step difference may be barely formed in the insulating interlayer at the boundary portion of the cell region and the peripheral region. Because the step difference may be barely formed at the insulating interlayer across the cell region and the peripheral region, a dishing defect may also be prevented and/or reduced. A residue defect generated due to partial remnants of some layers to be removed during a polish process may also be reduced. A high performance vertical type nonvolatile memory device may be manufactured.

Figure 23:
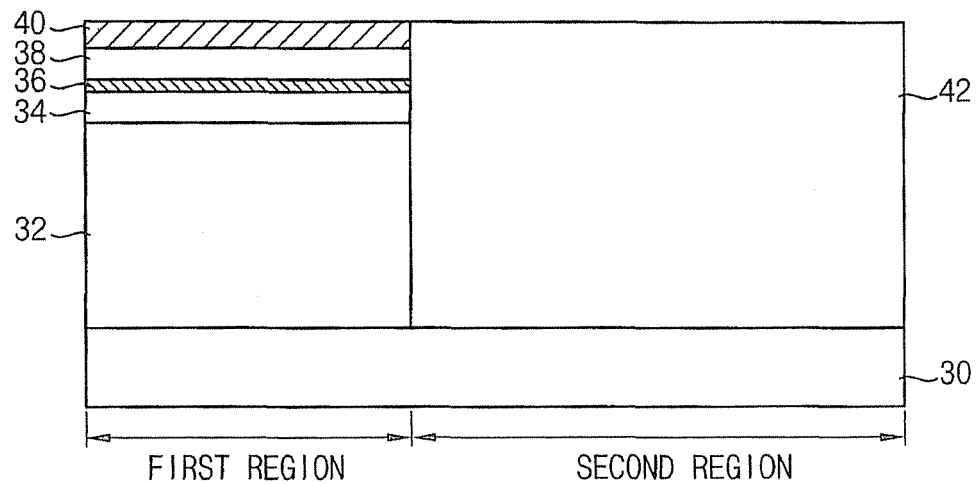

FIGS. 23-28 are cross-sectional diagrams illustrating methods of manufacturing semiconductor device channel pattern structures according to yet other example embodiments. Referring to FIG. 23, a mold layer (not illustrated) may be formed on a substrate 30 including a first region and a second region. The mold layer may be formed by integrating various kinds of different material layers. For example, the mold layer may be formed by alternately integrating two or more kinds of thin layers.

A first insulating interlayer (not illustrated) may be formed on the mold layer. On the first insulating interlayer, a first stopping layer (not illustrated) may be formed. The first stopping layer may be etch selective with respect to, for example, a silicon oxide and a semiconductor containing material provided to form a channel layer pattern. For example, an insulating interlayer and a silicon containing material may not be removed while performing a wet etch process to remove the first stopping layer.

The first stopping layer may be formed using a material with polish selectivity to, for example, a silicon oxide. The first stopping layer may be formed using a material that may stop the polishing of, for example, silicon oxide when the first stopping layer is exposed. The first stopping layer may not be formed using the silicon containing material so that the first stopping layer may be differentiated from the silicon containing material used for forming the channel layer pattern. The first stopping layer may be formed using, for example, silicon nitride and/or silicon oxynitride.

On the first stopping layer, a second insulating interlayer (not illustrated) may be formed. On the second insulating interlayer, a second stopping layer (not illustrated) may be formed. The second insulating interlayer may be thicker than the second stopping layer in order to ensure a sufficient thickness of the channel layer pattern. The second stopping layer may be formed using a material with polish selectivity to, for example, a silicon oxide. The second stopping layer may be formed using a material that may stop the polishing of, for example, a silicon oxide when the second stopping layer is exposed. The second stopping layer may be formed using a same material as or a different material from the material used for the first stopping layer. The second stopping layer may be formed using, for example, polysilicon or a silicon nitride.

The second stopping layer, the second insulating interlayer, the first stopping layer, the first insulating interlayer and the mold layer may be partially etched to form an integrated structure 32, a first insulating interlayer pattern 34, a first stopping layer pattern 36, a second insulating interlayer pattern 38 and a second stopping layer pattern 40 (hereinafter, "the patterns"). The patterns may be provided in the first region of the substrate 30. A preliminary third insulating interlayer (not illustrated) covering the patterns may be formed on the substrate 30. An upper surface portion of the preliminary third insulating interlayer may be positioned higher than an upper surface portion of thus formed patterns over an entire region on the substrate 30.

Figure 24:
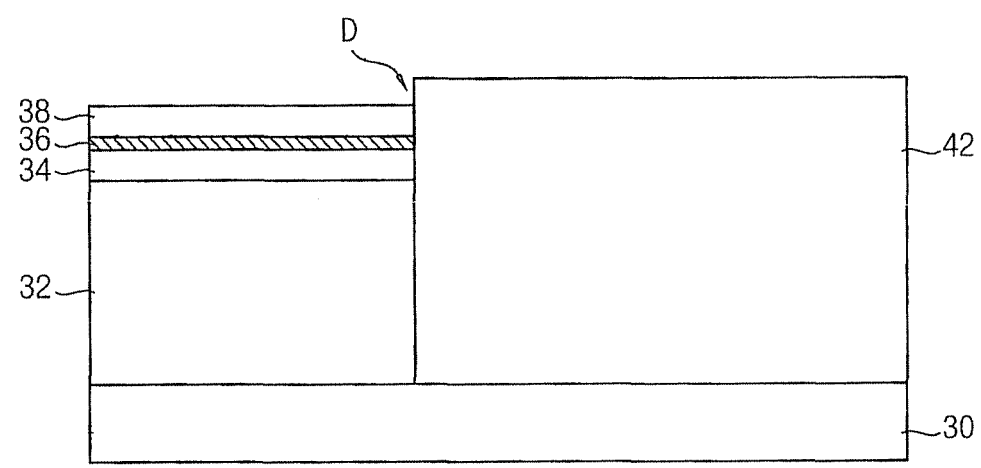

The preliminary third insulating interlayer may be polished from an upper surface portion to expose the surface portion of the second stopping layer pattern 40 and to form a third insulating interlayer 42. The second stopping layer pattern 40 may be used as a polish stopping layer. The third insulating interlayer 42 may be formed in the second region of the substrate 30. Referring to FIG. 24, the second stopping layer pattern 40 may be removed through, for example, a wet etch process. A mixture of ammonia ($NH_3$), hydrogen peroxide ($H_2O_2$) and water ($H_2O$) may be used as an etchant for the wet etch process. Upper surface portions of the second insulating interlayer pattern 38 and the third insulating interlayer 42 may be exposed. At a boundary portion of the exposed second insulating interlayer pattern 38 and the third insulating interlayer 42, a step difference (D) of a same thickness as the second stopping layer pattern 40 may be formed.

Figure 25:
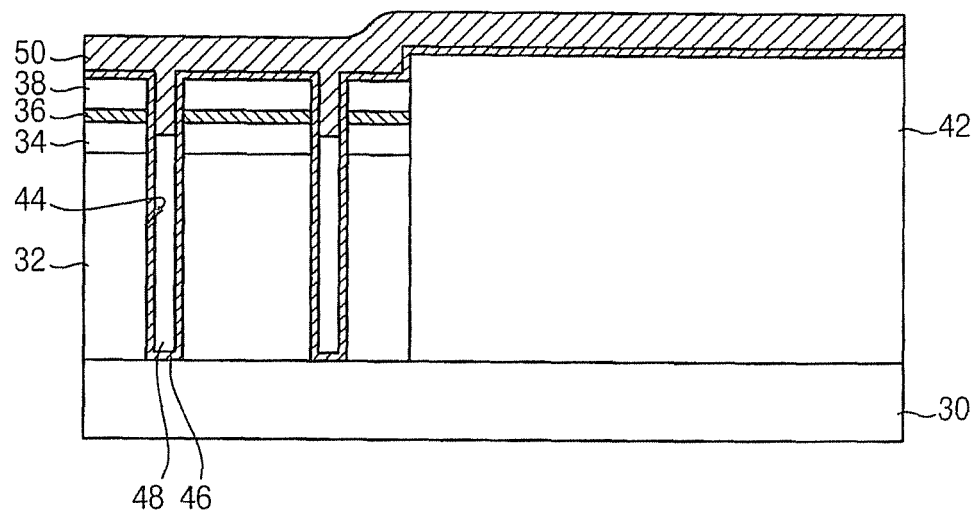

Referring to FIG. 25, the second insulating interlayer pattern 38, the first stopping layer pattern 36, the first insulating interlayer pattern 34 and the integrated structure pattern 32 may be partially etched to form channel holes 44. Through a bottom portion the channel holes 44, a surface portion of the substrate 30 may be exposed. A first semiconductor layer 46 (e.g., a polysilicon layer) may be formed along an inner portion of the channel holes 44 and upper surface portions of the second insulating interlayer pattern 38 and the third insulating interlayer 42. The first semiconductor layer 46 may be used as a channel layer. An insulating layer (not illustrated) filling up the inner portion of the channel holes 44 may be formed. The insulating layer may be partially etched to form an insulating layer pattern 48 within the channel holes 44.

An upper surface portion of the insulating layer pattern 48 formed through the etching process may be positioned lower than a bottom portion of the first stopping layer pattern 36. A second semiconductor layer 50 (e.g., a polysilicon layer) completely filling up the inner portions of the channel holes 44 may be formed on the insulating layer pattern 48. The second semiconductor layer 50 may also be formed on the second insulating interlayer pattern 38 and the third insulating interlayer 42. Due to the step difference between the second insulating layer pattern 38 and the third insulating interlayer 42, the second semiconductor layer 50 may be non-conformally deposited at the boundary portion of the second insulating interlayer pattern 38 and the third insulating interlayer 42.

Figure 26:
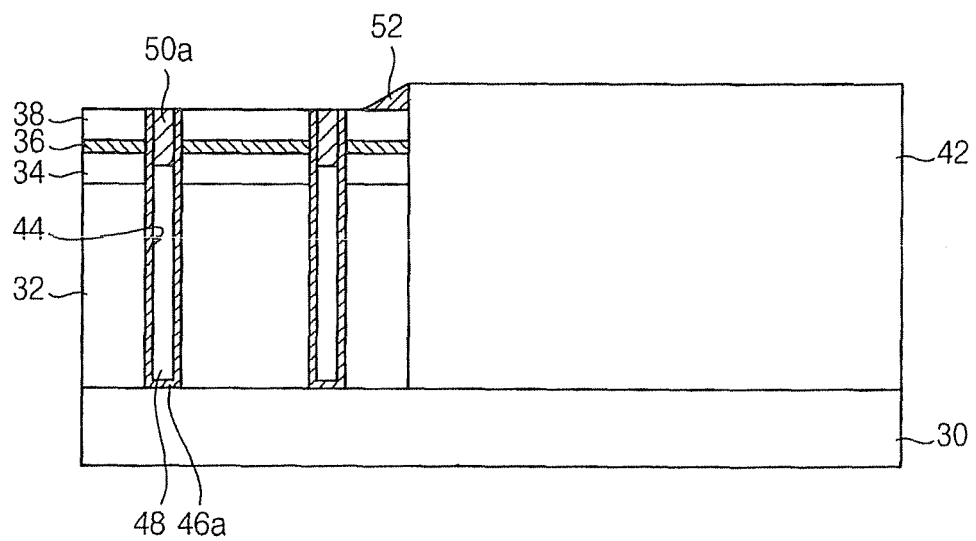

Referring to FIG. 26, the second semiconductor layer 50 and the first semiconductor layer 46 may be polished to expose an upper surface portion of the second insulating interlayer pattern 38 and the third insulating interlayer 42. The second insulating interlayer pattern 38 may be used as a polish stopping layer while performing the polish process. After completing the polish process, preliminary second semiconductor patterns 50a filling up an inlet portion of the channel holes 44 and first semiconductor patterns 46a may be formed. Because upper surface portions of the second insulating interlayer pattern 38 and the third insulating interlayer 42 are not provided in one plane (e.g., at the same level) and form a step difference, semiconductor (e.g., polysilicon) residue 52 may remain on the second insulating interlayer pattern 38 at the boundary portion of the second insulating interlayer pattern 38 and the third insulating interlayer 42.

Figure 27:
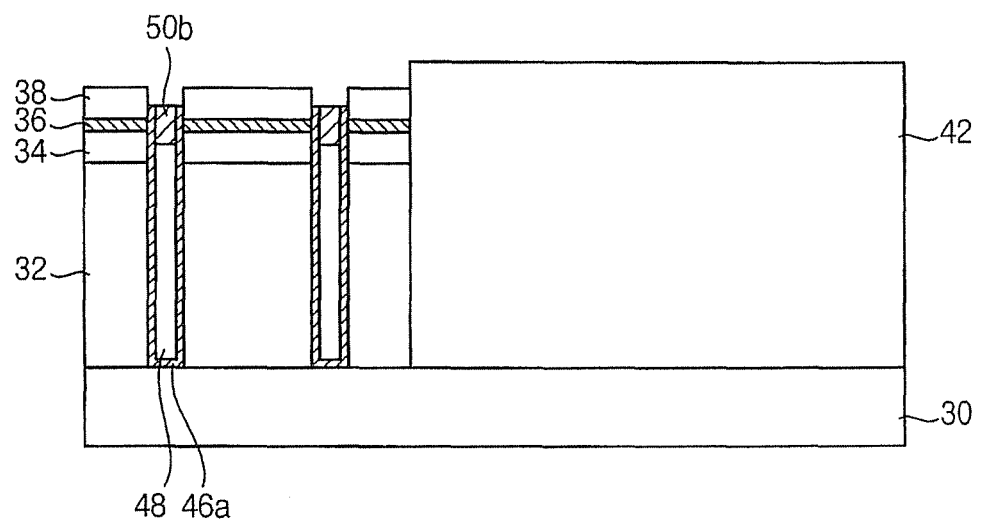

Referring to FIG. 27, the semiconductor residue 52 may be removed by performing, for example, a wet etch process for removing the semiconductor (e.g., polysilicon). A mixture of ammonia ($NH_3$), hydrogen peroxide ($H_2O_2$) and water ($H_2O$) may be used as an etchant for the wet etch process. The preliminary second semiconductor patterns 50a may be partially etched along with the semiconductor residue 52 to form second semiconductor (e.g., polysilicon) patterns 50b. An upper surface portion of the remaining second semiconductor patterns 50b may be positioned higher than an upper surface portion of the first stopping layer pattern 36 and a bottom portion of the remaining second semiconductor patterns 50b may be positioned lower than an upper surface portion of the first stopping layer pattern 36.

Because the residue 52 may be positioned at the boundary portion of the second insulating interlayer pattern 38 and the third insulating interlayer 42, the thickness of the residue 52 may be smaller than that of the second insulating interlayer pattern 38 and the third insulating interlayer 42. The step difference between the second insulating interlayer pattern 38 and the third insulating interlayer 42 may be the same as or smaller than a thickness of the second stopping layer pattern 40. Because the second insulating interlayer pattern 38 may be thicker than the second stopping layer pattern 40, the upper surface portion of the second semiconductor patterns 50b may be positioned higher than the upper surface portion of the first stopping layer pattern 36 after removing the residue 52.

Figure 28:
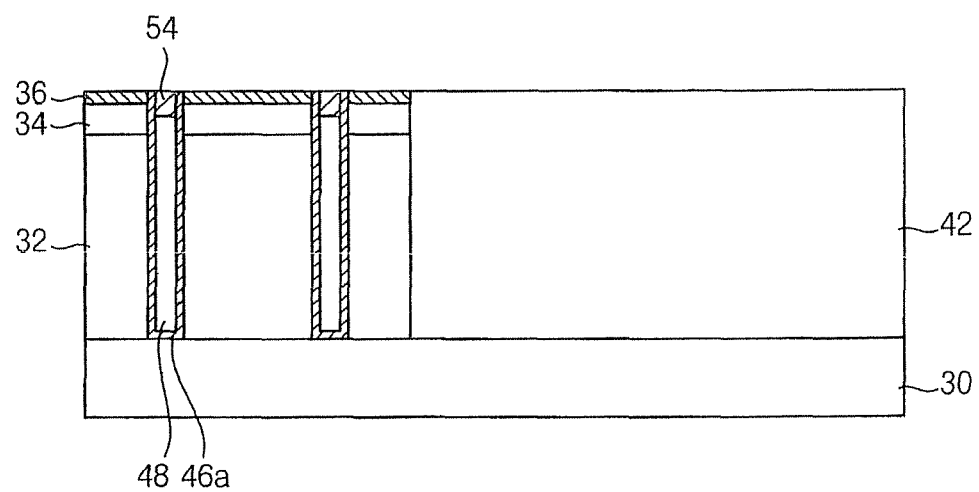

Referring to FIG. 28, the second insulating interlayer pattern 38 and the third insulating interlayer 42 may be polished to expose the upper surface portion of the first stopping layer pattern 36. The first stopping layer pattern 36 may be used as a polish stopping layer while performing the polish process. The second insulating interlayer pattern 38 may be completely removed. The second semiconductor patterns 50b may be polished using the first stopping layer pattern 36 as a polish stopping layer. A portion of the upper portion of the second semiconductor patterns 50b may be removed through the polish process to form pad electrodes 54. Upper surface portions of the first stopping layer pattern 36 and the pad electrodes 54 may be positioned in one plane. Upper surface portions of the pad electrodes 54 may be uniform with the stopping layer pattern 36.

A channel pattern structure including a channel layer pattern 46a with a macaroni shape, the insulating layer pattern 48 and the pad electrode 54 may be formed in the first region of the substrate 30. The channel pattern structures formed on the substrate 30 may be a uniform height. Although not illustrated, the first stopping layer pattern 36 may be removed. The first stopping layer pattern 36 may be removed by, for example, a wet etch process.

Figure 29:
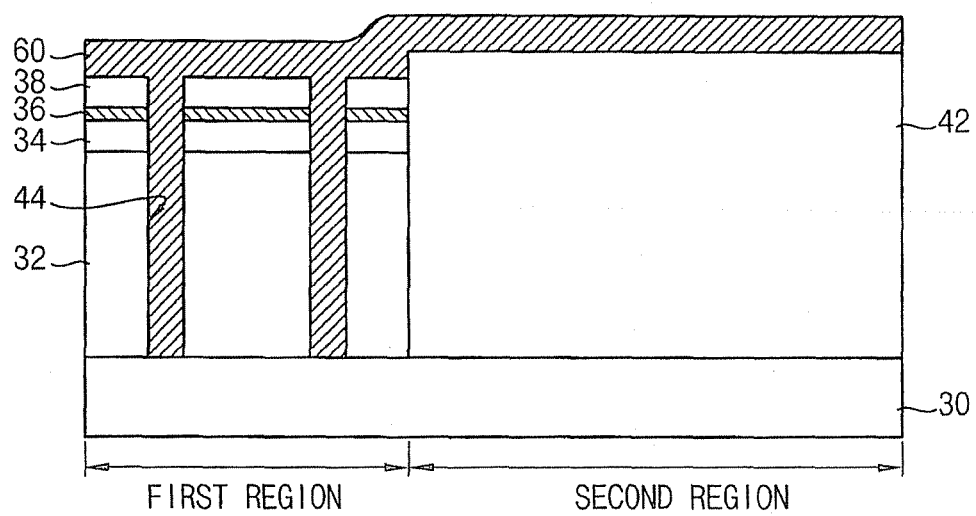

FIGS. 29-32 are cross-sectional diagrams illustrating methods of manufacturing semiconductor device channel pattern structures according to still other example embodiments. Processes described referring to FIGS. 23 and 24 may be performed to obtain the structure illustrated in FIG. 29. Referring to FIG. 29, a second insulating interlayer pattern 38, a first stopping layer pattern 36, a first insulating interlayer pattern 34 and an integrated layer pattern 32 may be partially etched to form channel holes 44. Through a bottom portion of the channel hole 44, a surface portion of a substrate 30 may be exposed.

A semiconductor layer 60 (e.g., a polysilicon layer) completely filling up an inner portion of the channel holes 44 and covering the second insulating interlayer pattern 38 and a third insulating interlayer 42 may be formed. Due to a step difference on upper surface portions of the second insulating interlayer pattern 38 and between the second insulating interlayer pattern 38 and the third insulating interlayer 42, the semiconductor layer 60 may be deposited non-conformally at a boundary portion of the second insulating interlayer pattern 38 and the third insulating interlayer 42.

Figure 30:
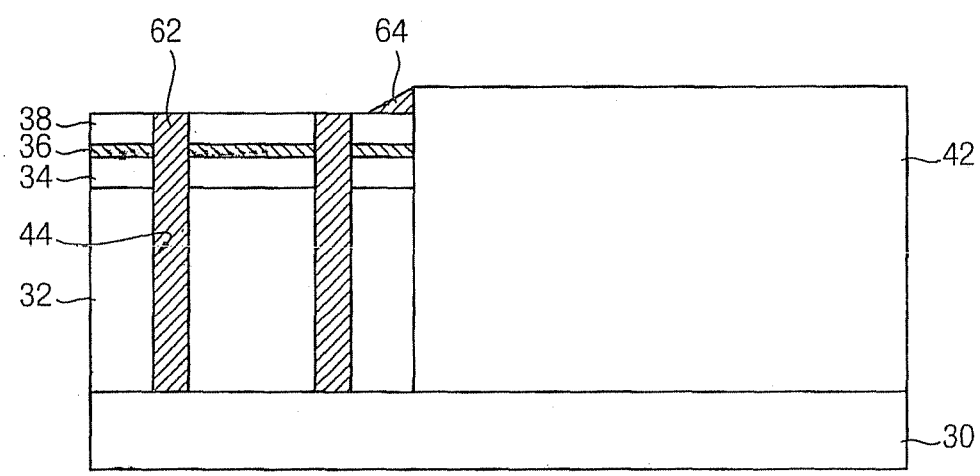

Referring to FIG. 30, the semiconductor layer 60 may be polished to expose the upper surface portions of the second insulating interlayer pattern 38 and the third insulating interlayer 42. The second insulating interlayer pattern 38 may be used as a polish stopping layer while performing the polish process. A preliminary semiconductor (e.g., polysilicon) pattern 62 filling up the inner portion of the channel holes 44 may be formed. Because the upper surface portions of the second insulating interlayer pattern 38 and the third insulating interlayer 42 may not be positioned in a same plane, a semiconductor residue 64 may remain on the second insulating interlayer pattern 38 at the boundary portion of the second insulating interlayer pattern 38 and the third insulating interlayer 42.

Figure 31:
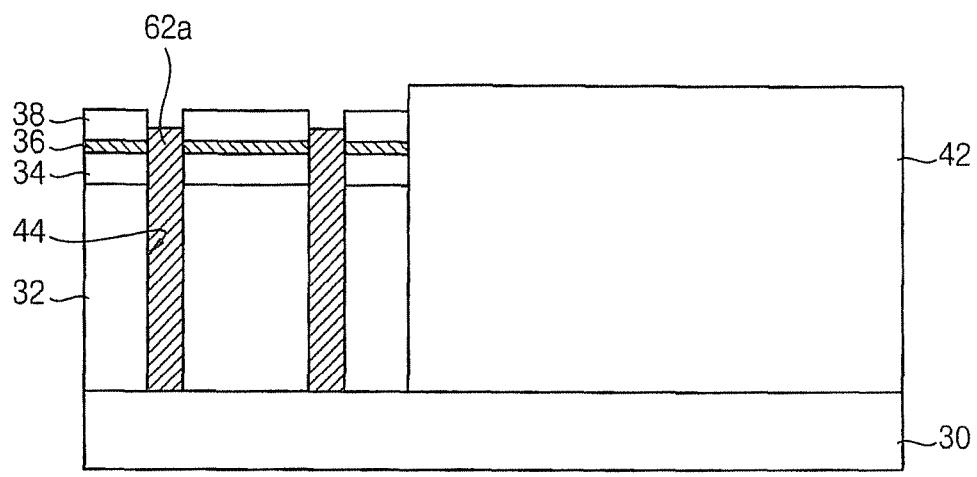

Referring to FIG. 31, the semiconductor residue 64 may be removed through performance of, for example, a wet etch process for removing the semiconductor (e.g., polysilicon). A mixture of ammonia ($NH_3$), hydrogen peroxide ($H_2O_2$) and water ($H_2O$) may be used as an etchant for the wet etch process. After performing the wet etch process, the preliminary semiconductor pattern 62 may be partially etched along with the semiconductor residue 64 to form a semiconductor pattern 62a. An upper surface portion of the semiconductor pattern 62a may be positioned higher than an upper surface portion of the first stopping layer pattern 36.

Figure 32:
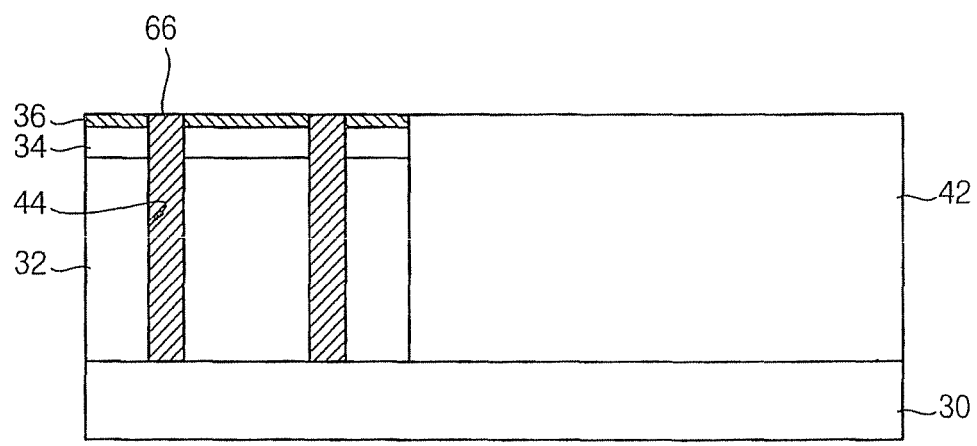

Referring to FIG. 32, the second insulating interlayer pattern 38 and the third insulating interlayer 42 may be polished to expose the upper surface portion of the first stopping layer pattern 36. The first stopping layer pattern 36 may be used as a polish stopping layer while performing the polish process. The semiconductor pattern 62a may be polished using the first stopping layer pattern 36 as a polish stopping layer. An upper portion of the semiconductor pattern 62a may be partially removed through the polish process to form a channel layer pattern 66. The channel layer pattern 66 may be pillar shaped.

Upper surface portions of the first stopping layer pattern 16 and the channel layer pattern 66 may be positioned on a same plane. The channel layer patterns 66 may be of uniform height. Although not illustrated, the first stopping layer pattern 36 may be removed. The first stopping layer pattern 36 may be removed through, for example, a wet etch process.

Figure 33:
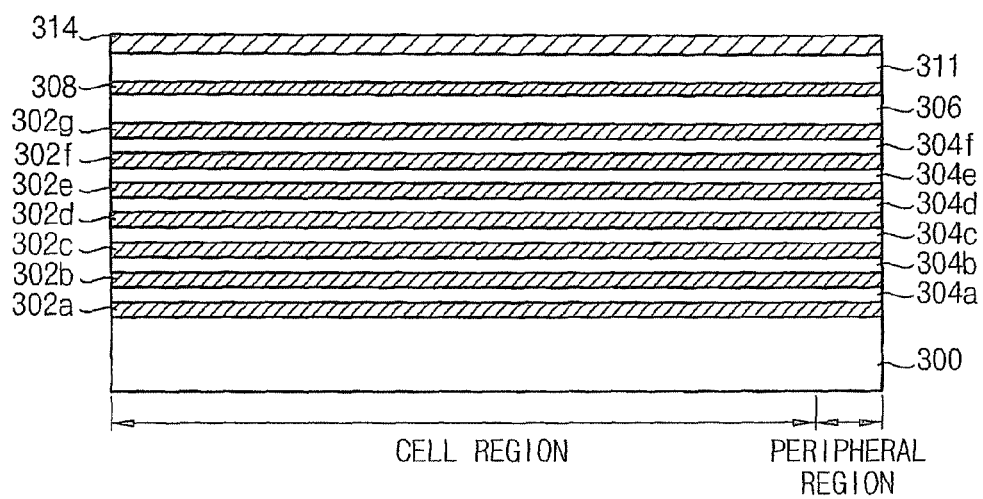

FIGS. 33-44 are cross-sectional diagrams illustrating methods of manufacturing vertical type semiconductor devices according to still further example embodiments. Referring to FIG. 33, a pad oxide layer (not illustrated) may be formed on a substrate 300 including a cell region and a peripheral region. The substrate 300 may be, for example, a single crystalline semiconductor substrate. On the pad oxide layer, a plurality of sacrificial layers and insulating interlayers may be alternately and repeatedly formed. First, second, third, fourth, fifth, sixth and seventh sacrificial layers 302a, 302b, 302c, 302d, 302e, 302f and 302g, and first, second, third, fourth, fifth and sixth insulating interlayers 304a, 304b, 304c, 304d, 304e and 304f may be alternately and repeatedly formed. The first to seventh sacrificial layers 302a, 302b, 302c, 302d, 302e, 302f and 302g each may be the same thickness. Further, the first to sixth insulating interlayers 304a, 304b, 304c, 304d, 304e and 304f each may be the same thickness.

A seventh insulating interlayer 306 may be formed on the seventh sacrificial layer 302g. The seventh insulating interlayer 306 may be thicker than the sixth insulating interlayer 304f. A first stopping layer 308 may be formed on the seventh insulating interlayer 306. The first stopping layer 308 may be formed using a material with etch selectivity to, for example, a silicon oxide and a semiconductor containing material (e.g., silicon containing material) provided for forming a channel layer pattern, respectively. A silicon oxide and a silicon containing material may not be removed while removing the first stopping layer 308 by a wet etch process.

The first stopping layer 308 may be formed using a material with polish selectivity to, for example, silicon oxide. The first stopping layer 308 may be differentiated from the silicon containing material provided for forming the channel layer pattern, and so may not be formed using the silicon containing material. The first stopping layer 308 may be formed using, for example, a silicon nitride and/or a silicon oxynitride. A total thickness of the seventh insulating interlayer 306 and the first stopping layer 308 may be the same as or larger than a length of an impurity region of a transistor to be formed at an uppermost portion. Accordingly, the total thickness of the seventh insulating interlayer 306 and the first stopping layer 308 may be controlled in accordance with the length of the impurity region of the transistor to be formed at the uppermost portion.

An eighth insulating interlayer 311 may be formed on the first stopping layer 308. The eighth insulating interlayer 311 may be thicker than the sixth insulating interlayer 304f. The eighth insulating interlayer 311 may be thicker than a second stopping layer 314 to be formed in a following process. When the thickness of the eighth insulating layer 311 is less than a thickness of the second stopping layer 314, a thickness of a second semiconductor layer pattern may decrease in a following process. In this case, a bit line pad with a sufficient thickness may not be obtained.

On the eighth insulating layer 311, a second stopping layer 314 may be formed. The second stopping layer 314 may be used as a polish stopping layer while performing a polish process with respect to a ninth insulating interlayer with a large step difference and formed in a following step. The second stopping layer 314 may be formed to a sufficient thickness so that the second stopping layer 314 may not be completely consumed while polish the ninth insulating interlayer. The second stopping layer 314 may be thicker than the first stopping layer 308. The second stopping layer 314 may be formed using a material with, for example, polish selectivity to a silicon oxide. The second stopping layer 314 may be formed using a material that may stop a polish process with respect to a silicon oxide when the second stopping layer 314 is exposed. The second stopping layer 314 may be formed using a same material as or a different material from the first stopping layer 308. The second stopping layer 314 may be formed, for example, using polysilicon and/or a silicon nitride.

Figure 34:
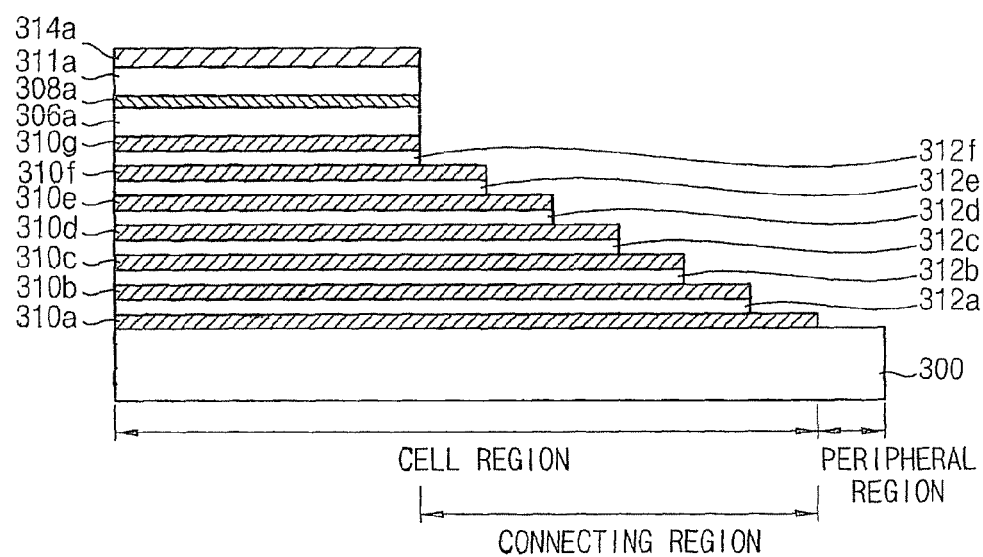

Referring to FIG. 34, the first and second stopping layers 308 and 314, the first to eighth insulating interlayers 304a, 304b, 304c, 304d, 304e, 304f, 306 and 311 and the first to seventh sacrificial layers 302a, 302b, 302c, 302d, 302e, 302f and 302g may be partially etched to form a mold structure. The mold structure may be formed in the first region of the substrate 300.

The mold structure may include a stair shape sidewall edge portion and first, second, third, fourth, fifth, sixth and seventh sacrificial layer patterns 310a, 310b, 310c, 310d, 310e, 310f and 310g and first, second, third, fourth, fifth and sixth insulating interlayer patterns 312a, 312b, 312c, 312d, 312e and 312f. On the seventh sacrificial layer pattern 310g, a seventh insulating interlayer pattern 306a, a first stopping layer pattern 308a, an eighth insulating interlayer pattern 311a and a second stopping layer pattern 314a may be formed. To manufacture the mold structure, for example, a plurality of etch processes may be performed. The sidewall edge portion with the stair shape of the first, second, third, fourth, fifth, sixth and seventh sacrificial layer patterns 310a, 310b, 310c, 310d, 310e, 310f and 310g and the first, second, third, fourth, fifth and sixth insulating interlayer patterns 312a, 312b, 312c, 312d, 312e and 312f may be positioned in a connecting region included in the cell region.

Because the sidewall edge portion is formed with a stair shape, an area of an underlying sacrificial layer pattern may be greater than an area of an upper lying sacrificial layer pattern. The length of the sacrificial layer patterns may be gradually increased from a upper portion to a bottom portion of the mold structure. The seventh insulating interlayer pattern 306a, the first stopping layer pattern 308a, the eighth insulating interlayer pattern 311a and the second stopping layer pattern 314a formed on the seventh sacrificial layer pattern 310a may not be stair shaped along a sidewall edge portion. The sidewall edge portion of the seventh insulating interlayer pattern 306a, the first stopping layer pattern 308a, the eighth insulating interlayer pattern 311a and the second stopping layer pattern 314a may be vertically straight.

Figure 35:
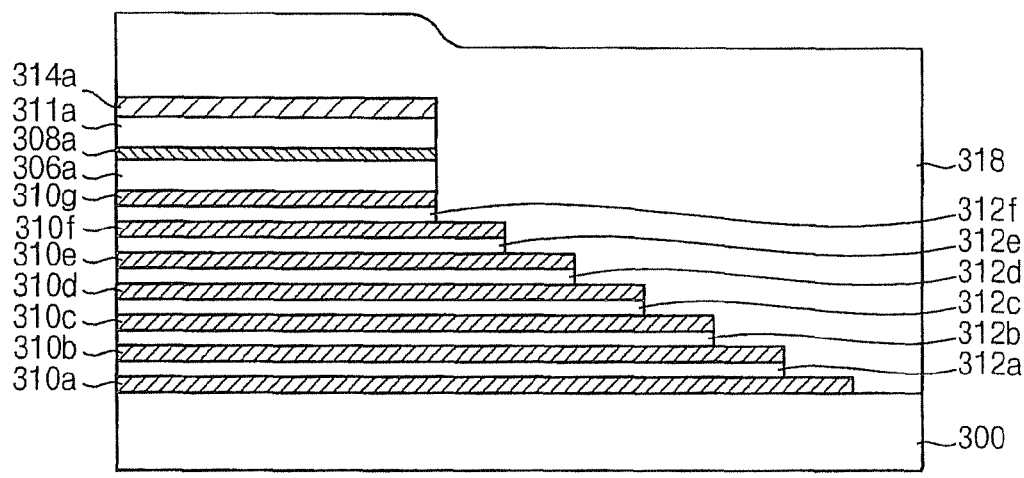
Figure 36:
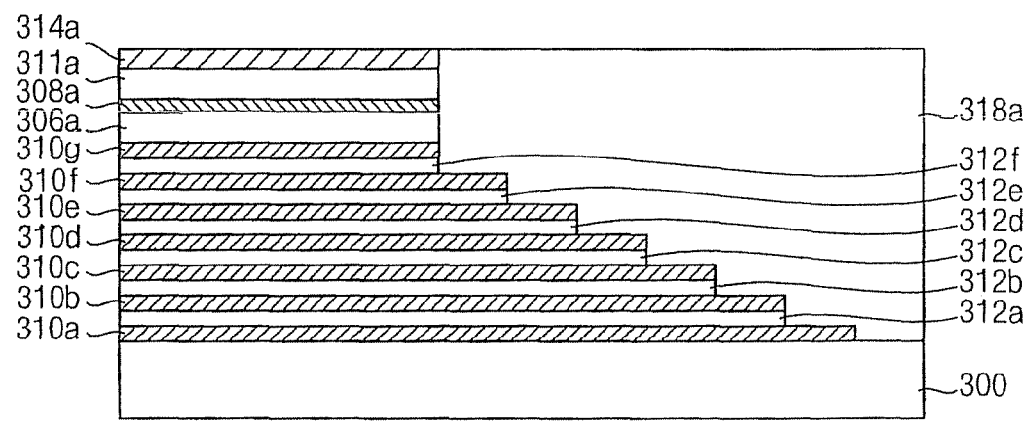

Referring to FIG. 35, a ninth insulating interlayer 318 covering the mold structure may be formed. The ninth insulating interlayer 318 may be partially etched from an upper portion to decrease a size of a step difference of the ninth insulating interlayer 318. The ninth insulating interlayer 318 provided above the second stopping layer pattern 314 may be partially etched. Referring to FIG. 36, the upper portion of the ninth insulating interlayer 318 may be polished to expose an upper surface portion of the second stopping layer pattern 314a and to form a ninth insulating interlayer pattern 318a. The second stopping layer pattern 314a may be used as a polish stopping layer of the polish process. The polish process may include, for example, a chemical mechanical planarization (CMP) process. Upper surface portions of the second stopping layer pattern 314a and the ninth insulating interlayer pattern 318a may be planarized and may be in a same plane (e.g., at the same level). There may be a step difference between the eighth insulating interlayer pattern 311a and the ninth insulating interlayer pattern 318a of about a thickness of the second stopping layer pattern 314a.

Figure 37:
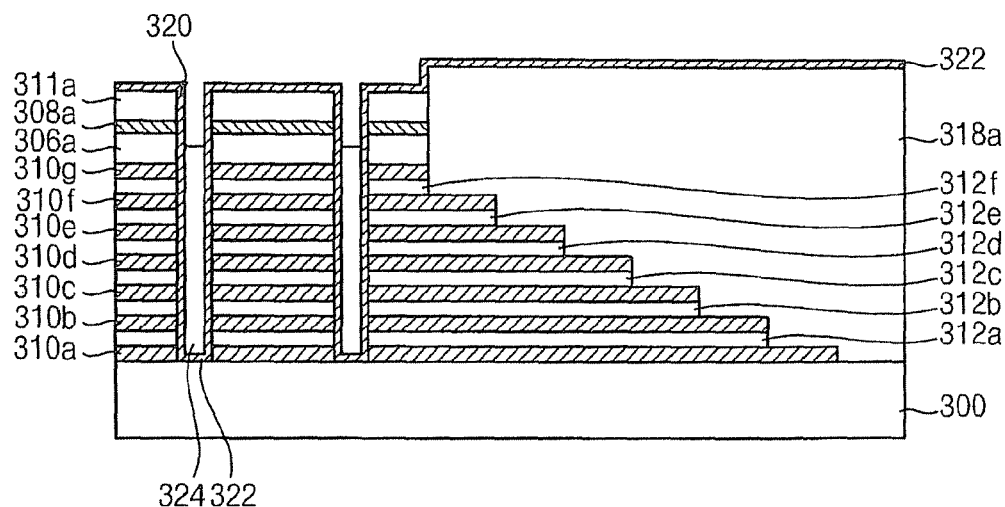

Referring to FIG. 37, the second stopping layer pattern 314a may be removed through a wet etch process. The eighth insulating interlayer pattern 311a may be exposed after performing the wet etch process. A mixture of ammonia ($NH_3$), hydrogen peroxide ($H_2O_2$) and water ($H_2O$) may be used as an etchant for the wet etch process. An etch mask pattern (not illustrated) for forming channel holes may be formed on the eighth insulating interlayer pattern 311a. The first stopping layer pattern 308a, the first to eighth insulating interlayer patterns 312a, 312b, 312c, 312d, 312e, 312f, 306a and 311a and the first to seventh sacrificial layer patterns 310a, 310b, 310c, 310d, 310e, 310f and 310g may be etched using the etch mask pattern as an etch mask to form channel holes 320.

A first semiconductor layer 322 (e.g., a polysilicon layer) may be formed on surface portions inside the channel holes 320 and on the upper surface portions of the eighth insulating interlayer pattern 311a and the ninth insulating interlayer pattern 318a. The first semiconductor layer 322 may be used as a channel layer. An insulating layer filling up an inner portion of the channel holes 320 may be formed. The insulating layer may be partially etched to form an insulating layer pattern 324 within the channel hole 320. An upper surface portion of the insulating layer pattern 324 may be positioned lower than a bottom surface portion of the first stopping layer pattern 308a.

Figure 38:
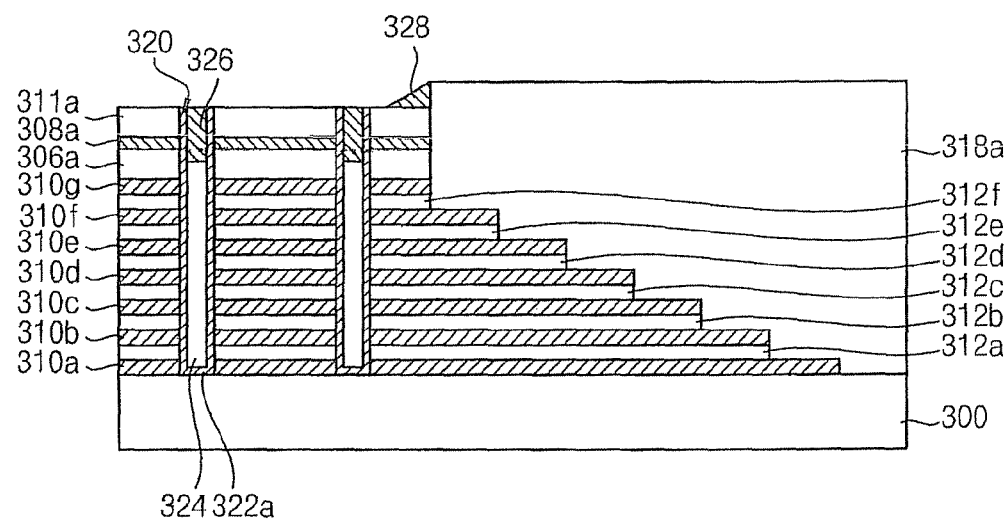

Referring to FIG. 38, a second semiconductor layer (e.g., a polysilicon layer) completely filling up the inner portion of the channel hole 320 may be formed on the insulating interlayer pattern 324. The second semiconductor layer may be formed on the upper surface portions of the eighth insulating interlayer pattern 311a and the ninth insulating interlayer pattern 318a. The second semiconductor layer and the first semiconductor layer 322 may be polished to expose an upper surface portion of the eighth insulating interlayer pattern 311a. The eighth insulating interlayer pattern 311a may be used as a polish stopping layer while performing the polish process. The polish process may be performed by means of a chemical mechanical planarization process. After performing the polish process, a first semiconductor pattern 322a with a macaroni shape, a preliminary second semiconductor pattern 326 and the insulating layer pattern 324 may be formed.

On the insulating layer pattern 324, the preliminary second semiconductor pattern 326 filling up an inlet portion of the channel hole 320 may be formed. The first semiconductor pattern 322a may be a channel layer pattern, which may be a channel region of transistors to be integrated vertically. The upper surface portions of the eighth insulating interlayer pattern 311a and the ninth insulating interlayer pattern 318a may not be provided on a same plane but form a step difference. Semiconductor residue 328 may remain at a boundary portion of the eighth insulating interlayer pattern 311a and the ninth insulating interlayer pattern 318a and on the eighth insulating interlayer pattern 311a. The remaining semiconductor residue 328 may deteriorate reliability of thus manufactured semiconductor devices.

Figure 39:
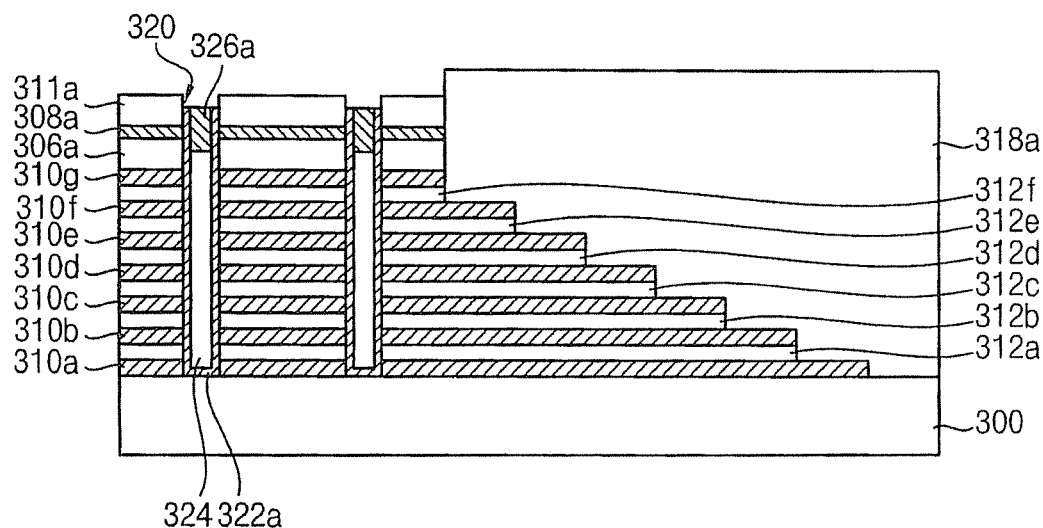

Referring to FIG. 39, the semiconductor residue 328 may be removed by performing, for example, a wet etch process for removing the semiconductor (e.g., polysilicon). A mixture of ammonia ($NH_3$), hydrogen peroxide ($H_2O_2$) and water ($H_2O$) may be used as an etchant for the wet etch process. The preliminary second semiconductor pattern 326 may be partially etched to a certain thickness along with the semiconductor residue 328 through the wet etch process. A second semiconductor pattern 326a thinner than the preliminary second semiconductor pattern 326 may be formed. An upper surface portion of the second semiconductor pattern 326a may be higher than an upper surface portion of the first stopping layer pattern 308a.

A thickness of the semiconductor residue 328 may be less than the step difference of the eighth and ninth insulating interlayer patterns 311a and 318a. The step difference of the eighth and ninth insulating interlayer patterns 311a and 318a may be the same as or smaller than the thickness of the second stopping layer pattern 314a. Because the eighth insulating interlayer pattern 311a may be formed to a thickness larger than the second stopping layer pattern 314a, the upper surface portion of the second semiconductor pattern 326a may be positioned higher than the upper surface portion of the first stopping layer pattern 308a after completely removing the semiconductor residue 328.

Figure 40:
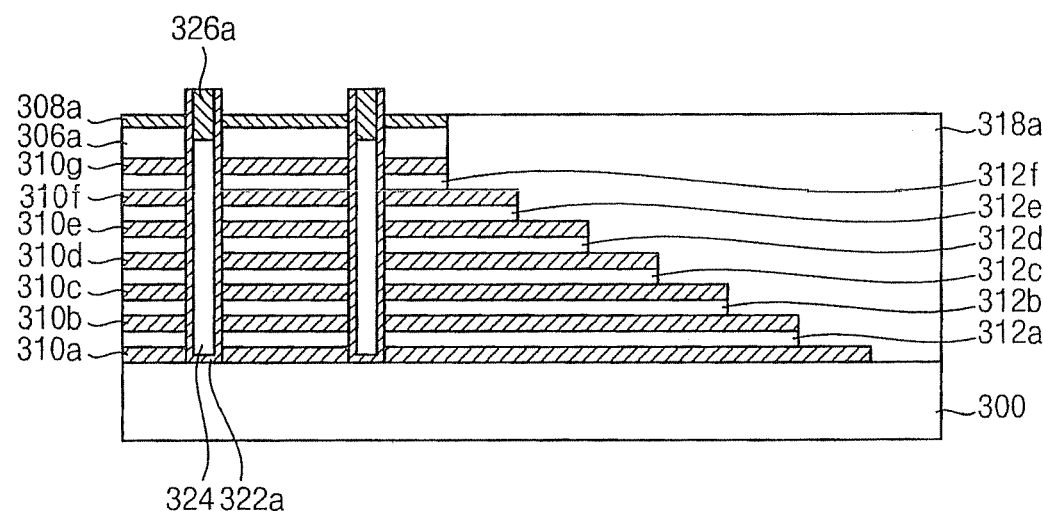

Referring to FIG. 40, the eighth insulating interlayer pattern 311a and the ninth insulating interlayer pattern 318a may be polished to expose the upper surface portion of the first stopping layer pattern 308a. The first stopping layer pattern 308a may be used as a polish stopping layer while performing the polish process. The eighth insulating interlayer pattern 311a may be completely removed after performing the polish process. The polish process may be performed by, for example, a chemical mechanical planarization process. While performing the polish process, the second semiconductor pattern 326a may be removed slowly as compared to the eighth and ninth insulating interlayer patterns 311a and 318a. The second semiconductor pattern 326a may protrude from the first stopping layer pattern 308a after performing the polish process.

Figure 41:
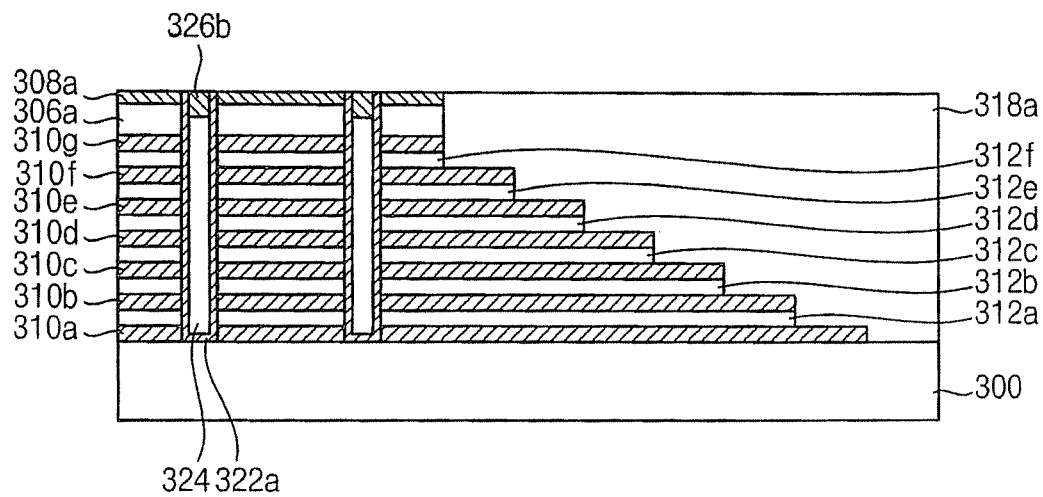

Referring to FIG. 41, the second semiconductor pattern 326a may be polished using the first stopping layer pattern 308a as a polish stopping layer. An upper portion of the second semiconductor pattern 326a may be partially removed through the polish process to form a bit line pad 326b. A channel pattern structure including a channel layer pattern and the bit line pad 326b may be formed. Upper surface portions of the first stopping layer pattern 308a and the bit line pad 326b may be provided in a same plane. Heights of the bit line pads 326b formed over an entire region of the substrate 300 may be uniform.

A distance from an upper surface portion of the uppermost sacrificial layer pattern to an upper surface portion of the bit line pad 326b may be a length of an impurity region of a transistor formed at an uppermost portion. Because heights of the bit line pads 326a to the upper surface portions thereof may be uniform, the lengths of the impurity regions of the uppermost transistors may be uniform across an entire region of the substrate 300. Generation of a dispersion defect of electric characteristics due to non-uniform lengths of the impurity regions may be decreased.

Figure 42:
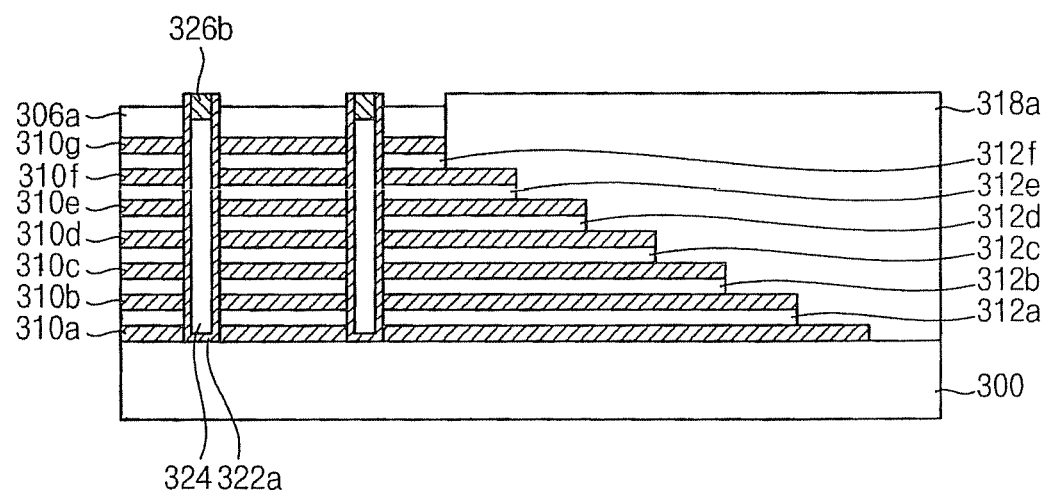

Referring to FIG. 42, the first stopping layer pattern 308a may be selectively removed. The removal of the first stopping layer pattern 308a may be performed by, for example, a wet etch process. Because the first stopping layer pattern 308a may have high etch selectivity to, for example, a silicon oxide and a silicon containing material, the insulating interlayer patterns and the semiconductor patterns may not be removed while performing the removing process of the first stopping layer pattern 308a. The seventh insulating interlayer pattern 306a may be exposed. The bit line pad 326b may protrude from an upper surface portion of the seventh insulating interlayer pattern 306a.

Figure 43:
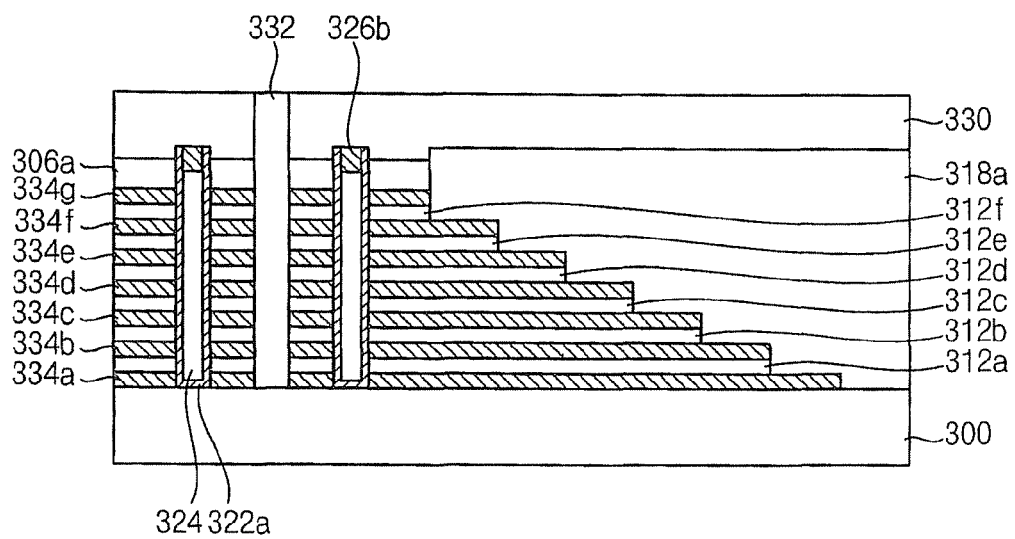

Referring to FIG. 43, a tenth insulating interlayer 330 covering the seventh insulating interlayer pattern 306a, the bit line pad 326b and the ninth insulating interlayer pattern 318a may be formed. The first to seventh insulating interlayer patterns 312a, 312b, 312c, 312d, 312e, 312f and 306a and the first to seventh sacrificial layer patterns 310a, 310b, 310c, 310d, 310e, 310f and 310g between the first semiconductor patterns 322a may be etched to form an opening portion exposing a surface portion of the substrate 300. The opening portion may be trench shaped and may extend in one direction. The first to seventh sacrificial layer patterns 310a, 310b, 310c, 310d, 310e, 310f and 310g exposed through a sidewall portion of the opening portion may be removed to form grooves.

A tunnel insulating layer (not illustrated), a charge trapping layer (not illustrated) and a blocking dielectric layer (not illustrated) may be formed along an inner surface portion of the grooves and the opening portion. On the blocking dielectric layer, a conductive layer (not illustrated) completely filling up an inner portion of the groove may be formed. The conductive layer may be formed by depositing a conductive material with a good step coverage characteristic and the generation of voids may be prevented or reduced. The conductive material may include a metal. The conductive material may include a material with low electrical resistivity, for example, tungsten, tungsten nitride, titanium, titanium nitride, tantalum, tantalum nitride and/or platinum. A barrier metal layer may be formed between the conductive layer and the blocking layer using, for example, titanium, titanium nitride, tantalum and/or tantalum nitride. A metal layer may be formed on the barrier metal layer using tungsten.

The conductive layer formed in the opening portion may be removed. The removing process may be performed using, for example, a wet etch process. The conductive layer formed in the grooves may remain to form first, second, third, fourth, fifth, sixth and seventh control gate electrodes 334a, 334b, 334c, 334d, 334e, 334f and 334g. The first, second, third, fourth, fifth, sixth and seventh control gate electrodes 334a, 334b, 334c, 334d, 334e, 334f and 334g may be numbered from the substrate 300. The first to seventh control gate electrodes 334a, 334b, 334c, 334d, 334e, 334f and 334g may include form a stair shaped sidewall edge portion. The exposed portion at the sidewall edge portion may be used as a pad for contacting a contact plug. Into the substrate 300 at the bottom portion of the opening portion between the first to seventh control gate electrodes 334a, 334b, 334c, 334d, 334e, 334f and 334g, n-type impurities may be doped to form an impurity doped region (not illustrated) used as a source line. An insulating layer filling up the opening portion may be formed and then planarized by a polish process to form a second insulating interlayer pattern 332.

Figure 44:
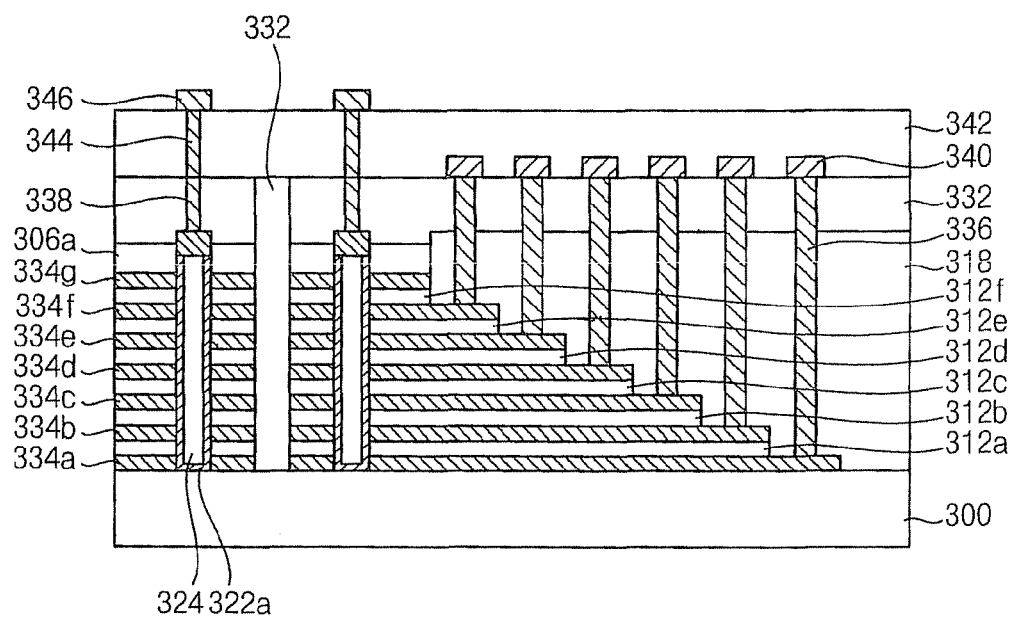

Referring to FIG. 44, a bit line contact 338 contacting an upper surface portion of the bit line pad 326b through the tenth insulating interlayer 330 may be formed. First contact plugs 336 contacting pad portions of the first to seventh control gate electrodes 334a, 334b, 334c, 334d, 334e, 334f and 334g through the tenth insulating interlayer 330 may be formed. The width of the pad portions of the first to seventh control gate electrodes 334a, 334b, 334c, 334d, 334e, 334f and 334g may be constant. A contact defect due to misalignment generated by positional deviation of the pad portions of the first to seventh control gate electrodes 334a, 334b, 334c, 334d, 334e, 334f and 334g may be barely generated while forming the first contact plugs 336.

Wiring lines 340 contacting an upper surface portion of the first contact plugs 336 may be formed. An eleventh insulating interlayer 342 covering the bit line contact 338 and the wiring lines 340 may be formed. Second contact plugs 344 contacting an upper surface portion of the bit line contacts 338 and bit lines 346 contacting the second contact plugs 344 may be formed. The bit lines 346 may be line shaped and extend in one direction, and may make an electrical connection with the channel layer patterns.

A vertical type nonvolatile memory device may include transistors with impurity doped regions of uniform length at an uppermost portion of the device. A semiconductor residue remaining on an insulating interlayer of the vertical type nonvolatile memory device may be completely removed through a wet etch process. Problems generated due to the semiconductor residue may be prevented and/or reduced.

Figure 45:
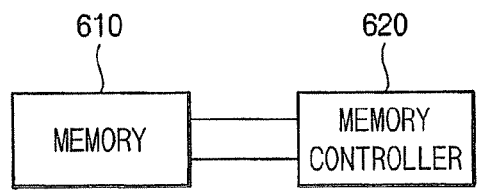

FIG. 45 is a block diagram illustrating example devices including vertical type semiconductor devices according to example embodiments. As illustrated in FIG. 45, example embodiments may include a memory 610 and a memory controller 620 connected to the memory 610. The memory 610 may include a vertical type nonvolatile memory device according to example embodiments illustrated in FIGS. 1-44. The memory controller 620 may provide an input signal for controlling operation of the memory 610.

Figure 46:
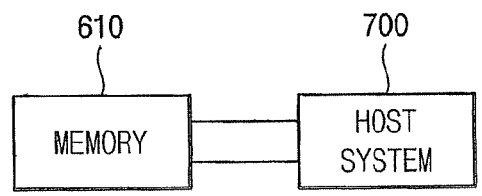

FIG. 46 is a block diagram illustrating other example devices including vertical type semiconductor devices according to still other example embodiments. Example embodiments may include a memory 610 and a host system 700 connected to the memory 610. The memory 610 may include a vertical type nonvolatile memory device according to example embodiments illustrated in FIGS. 1-44. The host system 700 may include an electronic appliance, for example, a personal computer, a camera, a mobile device, a game device, and/or a telecommunication device. The host system 700 may provide an input signal to control and operate the memory 610 and the memory 610 may be used as a data storing medium.

Figure 47:
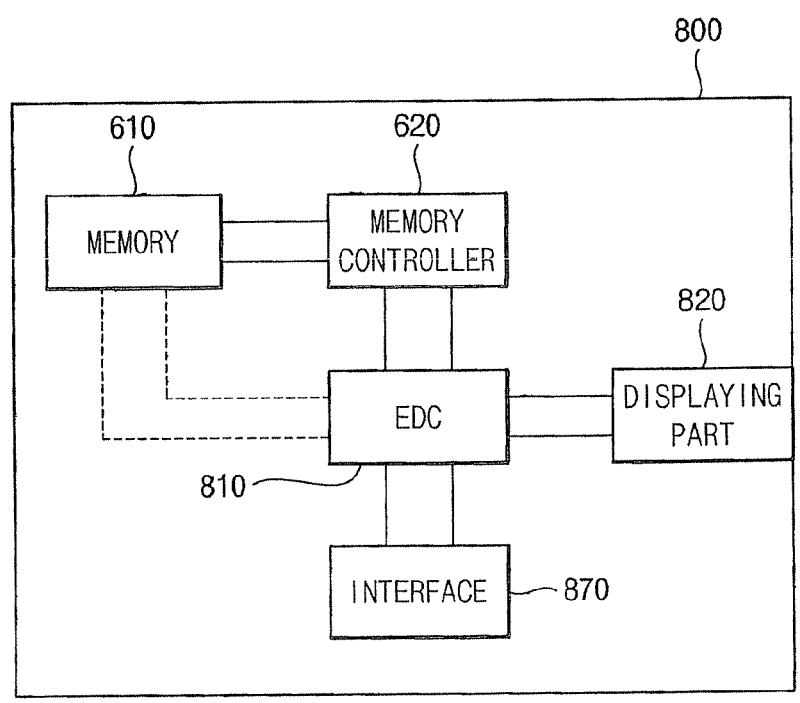

FIG. 47 is a block diagram illustrating yet other example devices including vertical type semiconductor devices according to further example embodiments. Example embodiments may include a portable device 800. The portable device 800 may include an MP3 player, a video player, and/or a complex device of a video and audio player. The portable device 800 may include a memory 610 and a memory controller 620 as illustrated in FIG. 47. The memory 610 may include a vertical type nonvolatile memory device having a structure according to example embodiments illustrated in FIGS. 1-44. The portable device 800 may include an encoder/decoder EDC 810, a displaying part 820 and an interface 870. Data (e.g., audio data and/or video data) may be input to/output from the memory 610 via the memory controller 620 by the encoder/decoder 810.

A vertical type nonvolatile memory device of good performance and reduced defect generating ratio may be provided in accordance with example embodiments. The vertical type nonvolatile memory device may be positively applied to a highly integrated semiconductor device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments of the inventive concepts. Therefore, it is to be understood that the foregoing is illustrative of various example embodiments and the inventive concepts are not to be construed as limited to the specific example embodiments disclosed, and that modifications to the disclosed example embodiments, as well as other example embodiments, are intended to be included within the scope of the present disclosure. While example embodiments have been particularly shown and described, it will be understood by one of ordinary skill in the art that variations in form and detail may be made therein without departing from the spirit and scope of the claims.

What is claimed is:

1. A method of manufacturing a semiconductor device, comprising:
    forming an integrated structure, a first insulating interlayer pattern, a first stopping layer pattern, a second insulating interlayer pattern and a second stopping layer pattern in a first region of a substrate, the substrate including the first region and a second region;
    forming a third insulating interlayer pattern in the second region of the substrate with an upper surface at about a same level as an upper surface of the second stopping layer pattern;
    removing the second stopping layer pattern;
    forming a preliminary channel layer pattern penetrating a portion of the second insulating interlayer pattern, the first stopping layer, the first insulating interlayer pattern and the integrated structure;
    removing a portion of the preliminary channel layer pattern;
    removing residue at a step portion, the step portion including the second and third insulating interlayers; and
    polishing a remainder of the preliminary channel layer pattern, the second insulating interlayer pattern and the third insulating interlayer pattern to expose an upper surface of the first stopping layer pattern and to form a channel pattern structure.

2. The method of claim 1, wherein the forming a first stopping layer pattern includes forming the first stopping layer pattern to include a material with etch selectivity to the preliminary channel layer pattern and the first, second and third insulating interlayers.

3. The method of claim 2, wherein the material includes at least one of a silicon nitride and a silicon oxynitride.

4. The method of claim 1, wherein the forming a second stopping layer pattern includes forming the second stopping layer pattern to include a material with polish selectivity to the second and third insulating interlayer patterns.

5. The method of claim 1, wherein the second insulating interlayer pattern is thicker than the second stopping layer pattern.

6. The method of claim 1, wherein the removing residue includes a wet etch and an upper surface portion of the preliminary channel layer pattern is higher than an upper surface portion of the first stopping layer pattern after the wet etch.

7. The method of claim 1, wherein the forming a preliminary channel layer pattern includes:
    etching the second insulating interlayer pattern, the first stopping layer pattern, the first insulating interlayer pattern and the integrated structure to form channel holes;
    forming a first polysilicon pattern in the channel holes on surfaces of the second insulating interlayer pattern, the first stopping layer pattern, the first insulating interlayer pattern and the integrated structure;
    forming an insulating layer pattern on the first polysilicon pattern to fill a portion of the channel holes; and
    forming a second polysilicon pattern on the insulating layer pattern to fill a remaining portion of the channel holes.

8. The method of claim 1, further comprising:
    forming a blocking dielectric layer, a charge storing layer, a tunnel insulating layer and a gate electrode on a sidewall of the channel pattern structure.

9. The method of claim 1, wherein the forming a third insulating interlayer pattern includes:
    forming a third insulating interlayer covering the second stopping layer pattern such that an upper surface of the third insulating interlayer is one of at about a same level as and higher than a bottom portion of the second stopping layer pattern; and
    polishing the third insulating interlayer to expose an upper surface of the second stopping layer pattern.

10. The method of claim 1, wherein forming of the integrated structure, the first insulating interlayer pattern, the first stopping layer pattern, the second insulating interlayer pattern and the second stopping layer pattern includes:
    forming a mold layer on the substrate by alternately depositing a silicon oxide and a silicon nitride a plurality of times;
    forming a first insulating interlayer, a first stopping layer, a second insulating interlayer and a second stopping layer on the mold layer; and
    patterning the mold layer, the first insulating interlayer, the first stopping layer, the second insulating interlayer and the second stopping layer.

* * * * *